United States Patent
Chung et al.

(10) Patent No.: US 11,532,711 B2
(45) Date of Patent: Dec. 20, 2022

(54) PMOSFET SOURCE DRAIN

(71) Applicant: Taiwan Semiconductor Manufacturing Co., Ltd., Hsin-Chu (TW)

(72) Inventors: Cheng-Ting Chung, Hsinchu (TW); Kuan-Lun Cheng, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

(21) Appl. No.: 17/021,765

(22) Filed: Sep. 15, 2020

(65) Prior Publication Data

US 2021/0328020 A1 Oct. 21, 2021

Related U.S. Application Data

(60) Provisional application No. 63/010,834, filed on Apr. 16, 2020.

(51) Int. Cl.
*H01L 29/78* (2006.01)
*H01L 29/167* (2006.01)
*H01L 29/165* (2006.01)
*H01L 29/66* (2006.01)
*H01L 29/06* (2006.01)

(52) U.S. Cl.
CPC .......... *H01L 29/167* (2013.01); *H01L 29/165* (2013.01); *H01L 29/66545* (2013.01); *H01L 29/66553* (2013.01); *H01L 29/66795* (2013.01); *H01L 29/785* (2013.01); *H01L 29/7848* (2013.01); *H01L 29/0669* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 9,818,872 | B2 | 11/2017 | Ching et al. |
| 9,887,269 | B2 | 2/2018 | Ching et al. |
| 9,899,398 | B1 | 2/2018 | Colinge et al. |
| 10,032,627 | B2 | 7/2018 | Lee et al. |
| 10,109,721 | B2 | 10/2018 | Lin et al. |
| 10,157,799 | B2 | 12/2018 | Ching et al. |

(Continued)

FOREIGN PATENT DOCUMENTS

| | | |
|---|---|---|
| KR | 20170063353 A | 6/2017 |
| KR | 20190024535 A | 3/2019 |

(Continued)

*Primary Examiner* — Ali Naraghi
(74) *Attorney, Agent, or Firm* — Haynes and Boone, LLP

(57) ABSTRACT

A semiconductor device according to the present disclosure includes a first source/drain epitaxial feature and a second source/drain epitaxial feature each having an outer liner layer and an inner filler layer, a plurality of channel members extending between the first source/drain epitaxial feature and the second source/drain epitaxial feature along a first direction, and a gate structure disposed over and around the plurality of channel members. The plurality of channel members are in contact with the outer liner layer and are spaced apart from the inner filler layer. The outer liner layer comprises germanium and boron and the inner filler layer comprises germanium and gallium.

20 Claims, 19 Drawing Sheets

(56) References Cited

U.S. PATENT DOCUMENTS

| | | |
|---|---|---|
| 10,199,502 B2 | 2/2019 | Huang et al. |
| 10,290,546 B2 | 5/2019 | Chiang et al. |
| 10,475,902 B2 | 11/2019 | Lee et al. |
| 11,075,273 B1 * | 7/2021 | Reznicek ............ H01L 21/0262 |
| 2011/0163360 A1 | 7/2011 | Zhang et al. |
| 2015/0200299 A1 | 7/2015 | Chen et al. |
| 2017/0154958 A1 | 6/2017 | Fung et al. |
| 2017/0345915 A1 * | 11/2017 | Coquand ........... H01L 29/66545 |
| 2018/0047853 A1 * | 2/2018 | Chang ............... H01L 29/78696 |
| 2018/0175036 A1 | 6/2018 | Ching et al. |
| 2019/0067441 A1 | 2/2019 | Yang et al. |
| 2020/0013900 A1 * | 1/2020 | Carr ................. H01L 21/76865 |
| 2020/0105872 A1 * | 4/2020 | Glass ................ H01L 29/78618 |
| 2020/0357931 A1 * | 11/2020 | Lee ........................ H01L 29/36 |

FOREIGN PATENT DOCUMENTS

| | | |
|---|---|---|
| TW | 201824400 A | 7/2018 |
| WO | 2019133013 A1 | 7/2019 |

\* cited by examiner

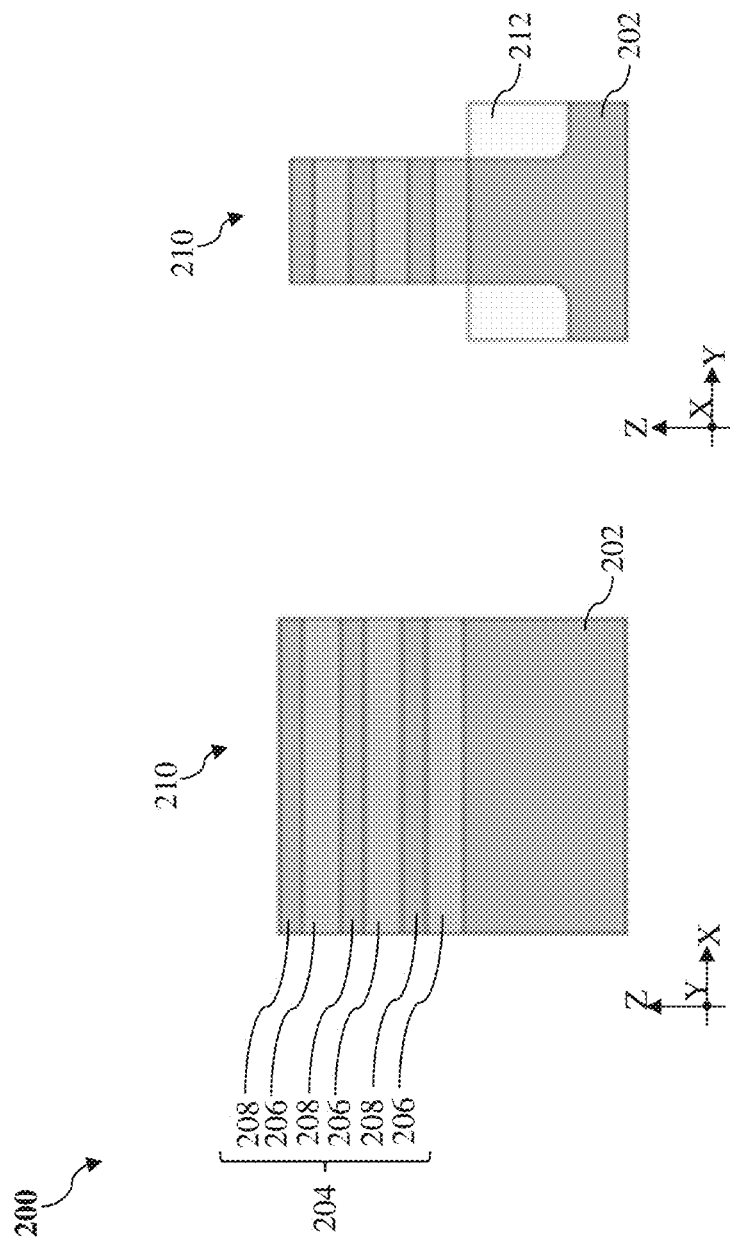

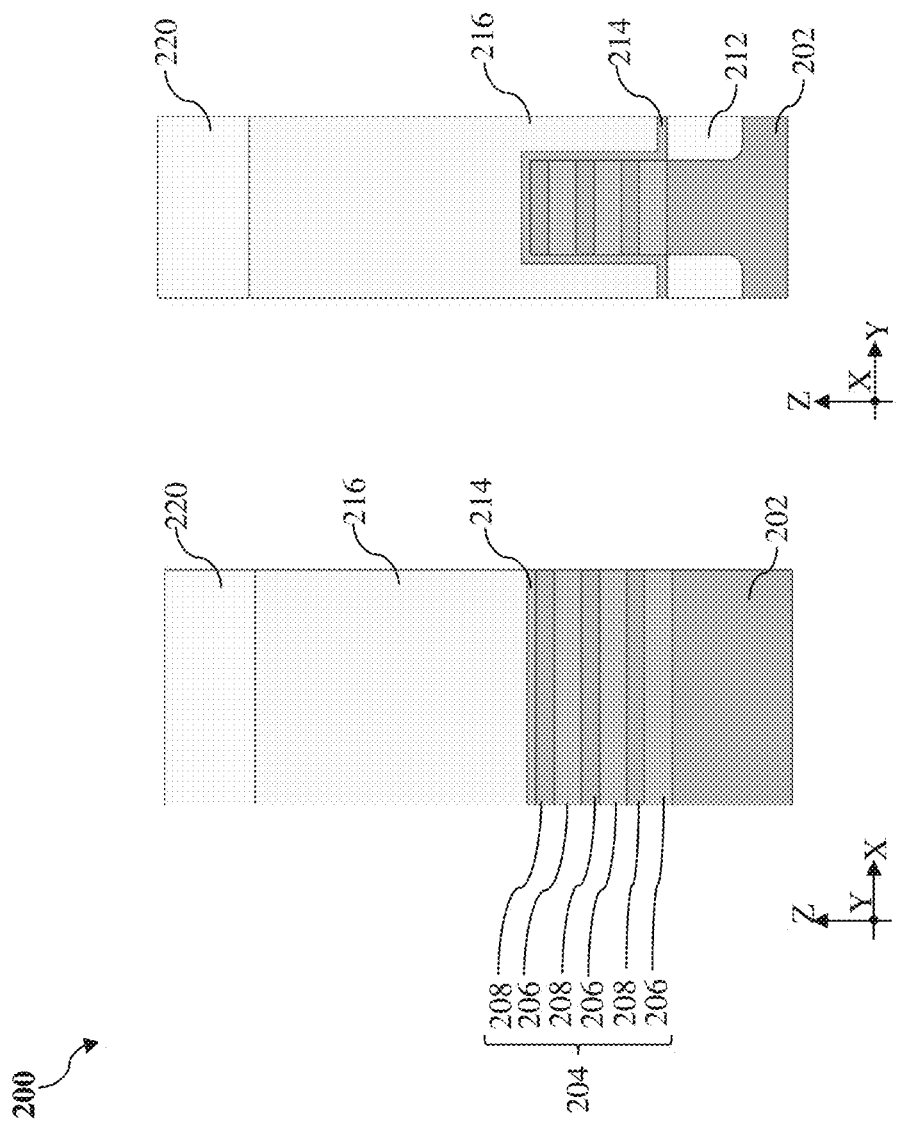

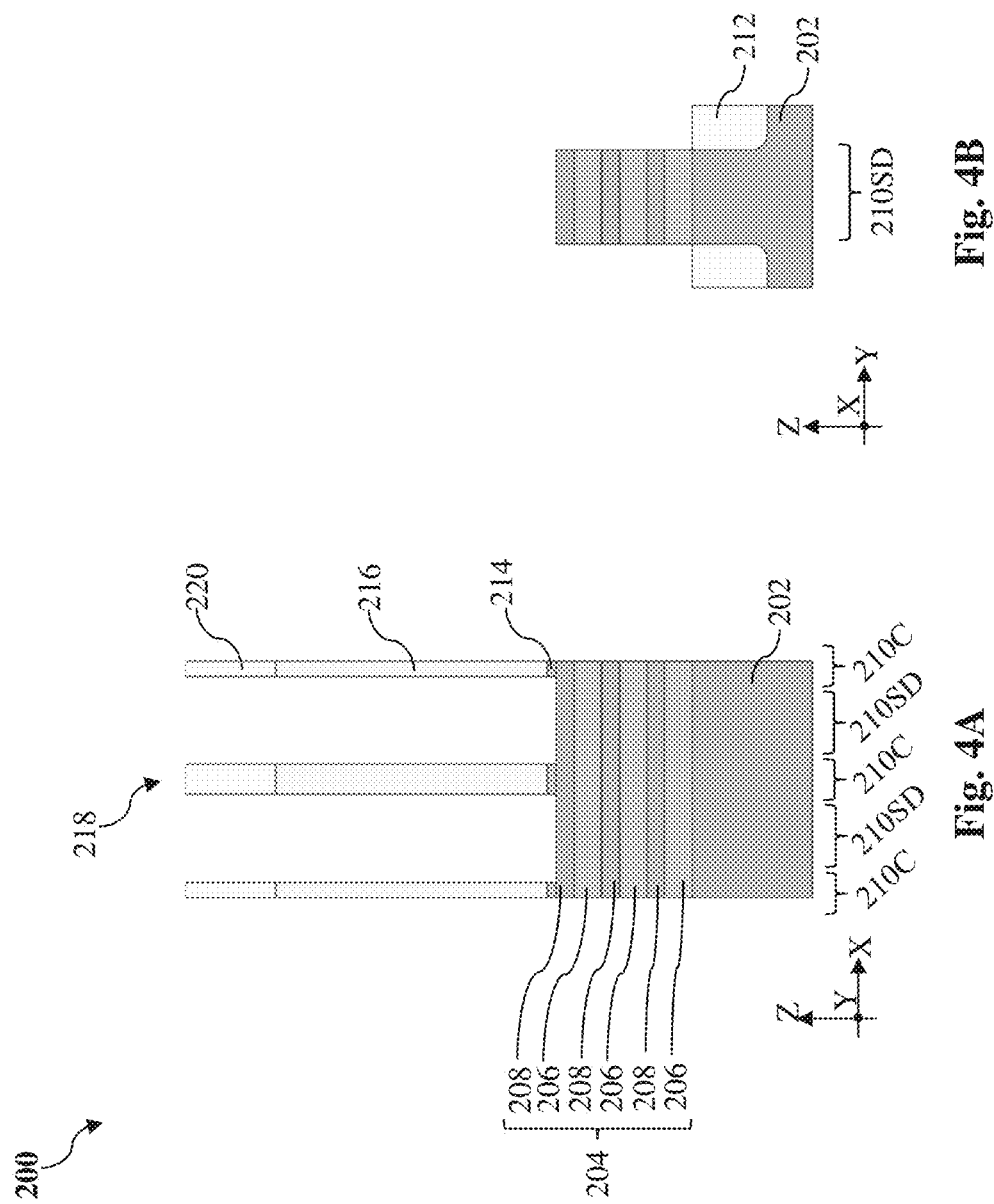

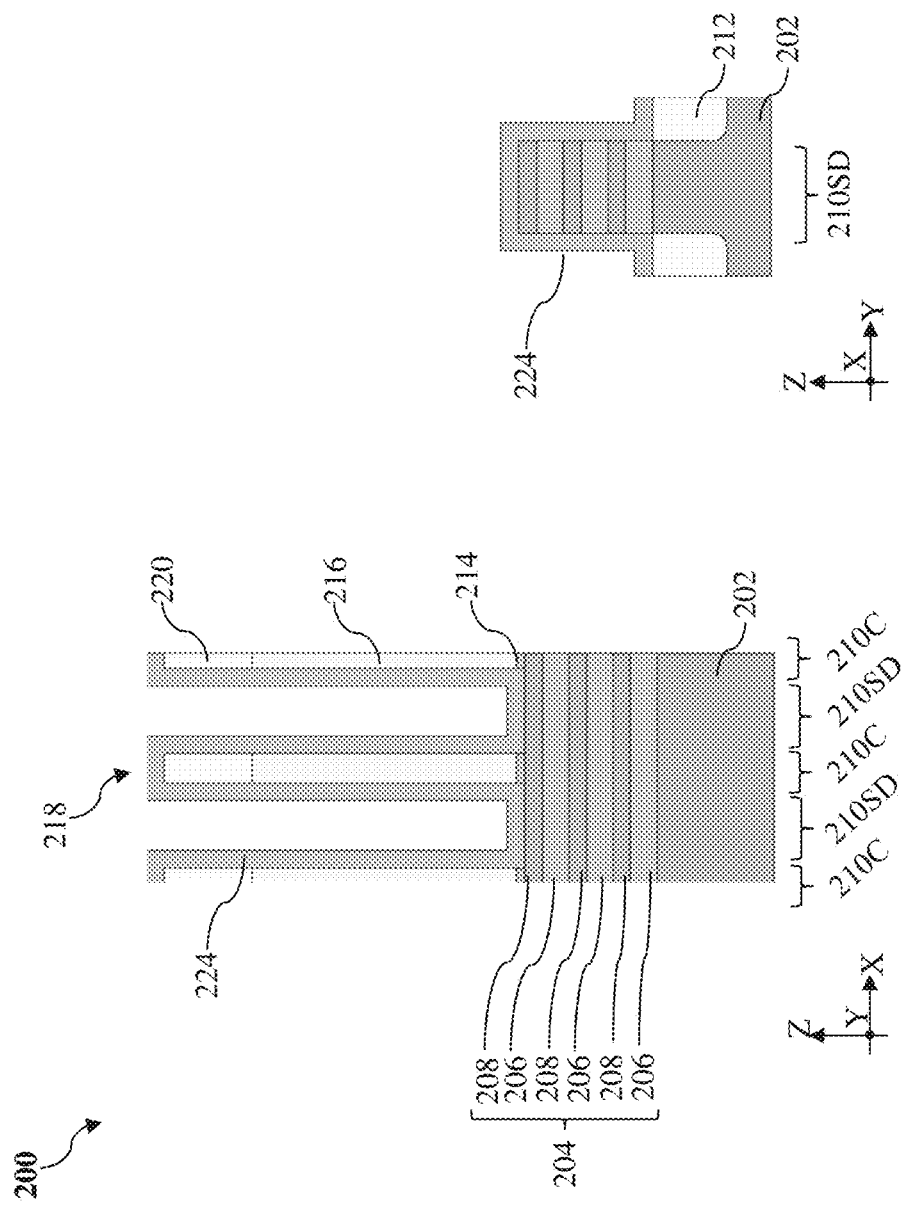

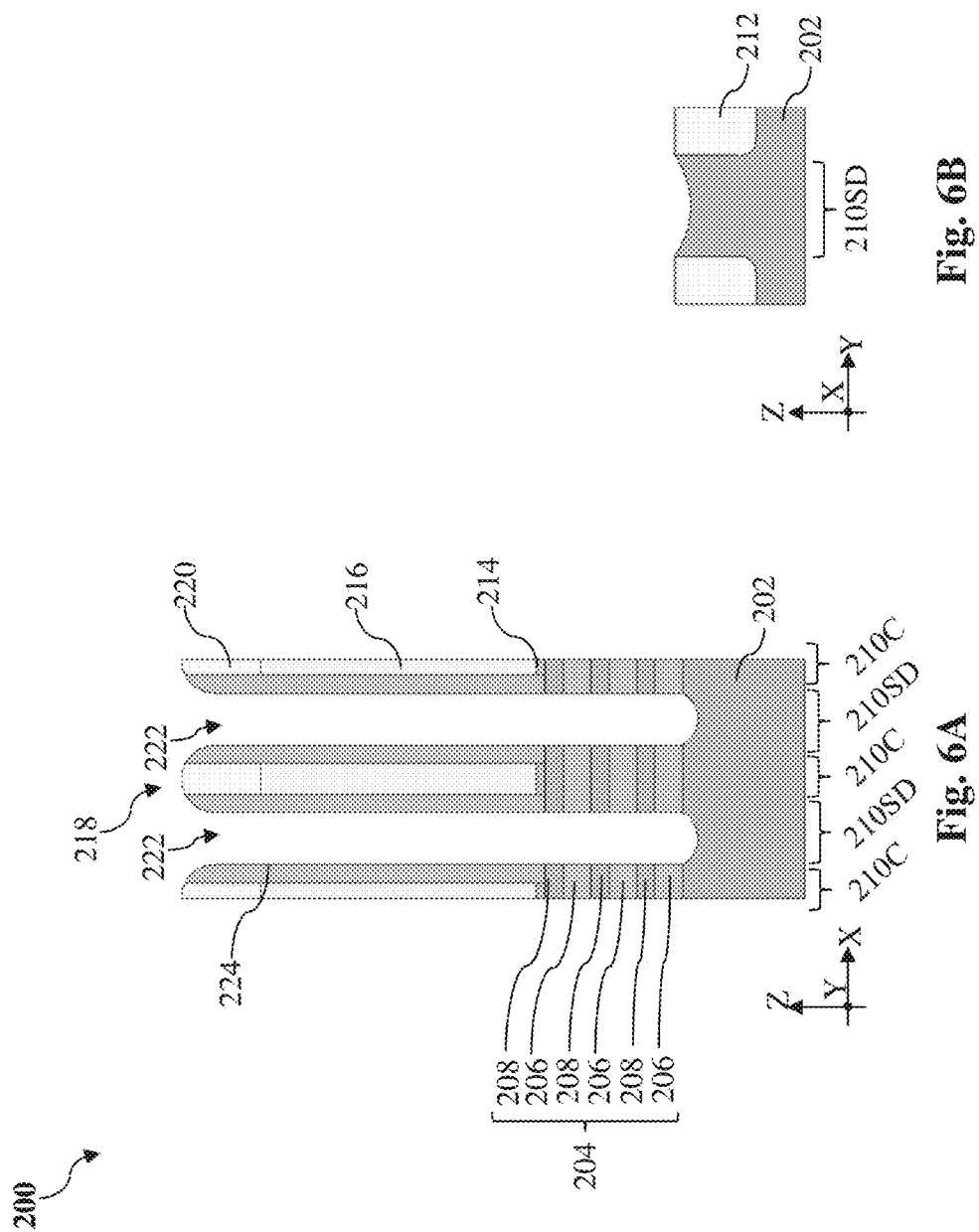

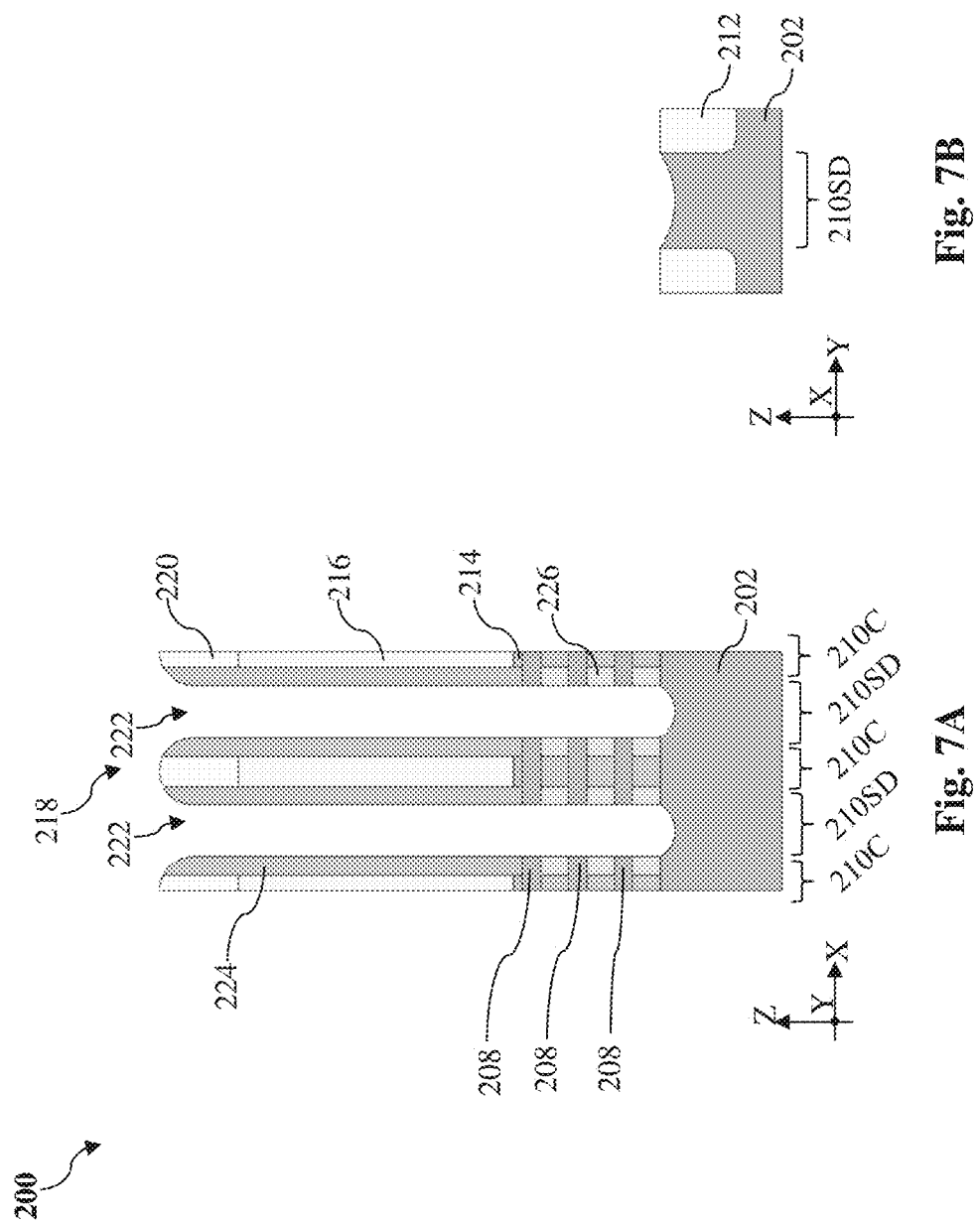

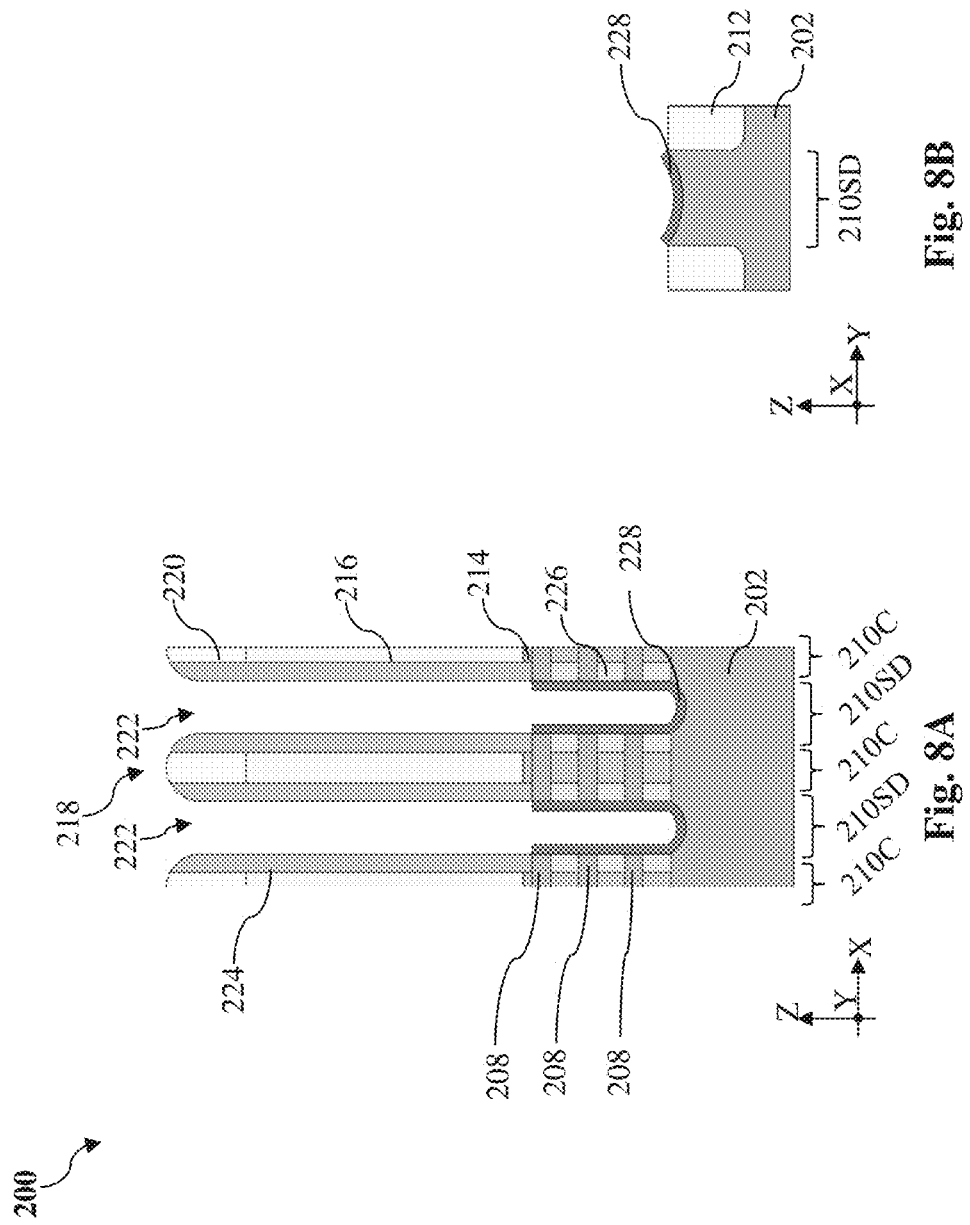

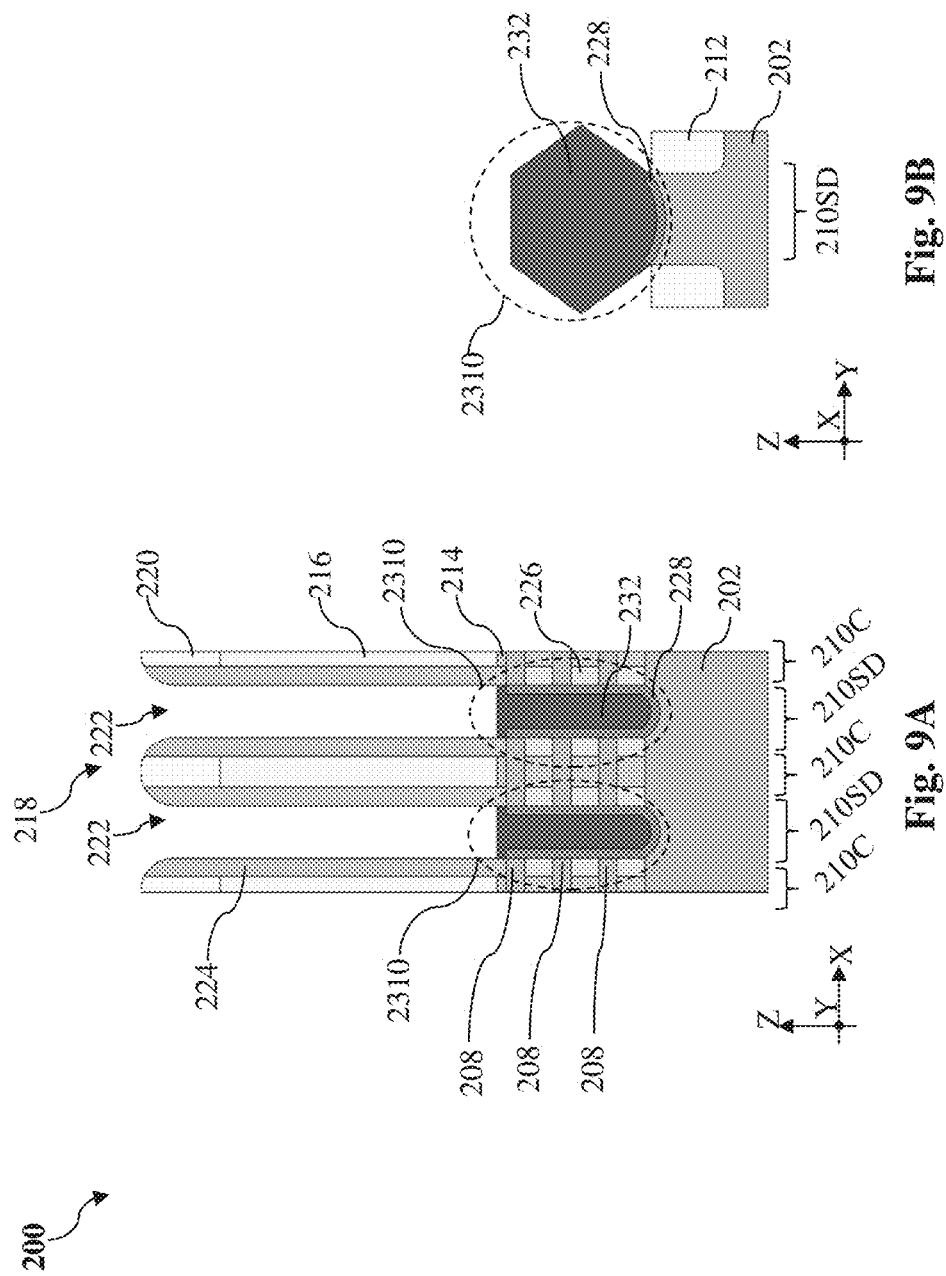

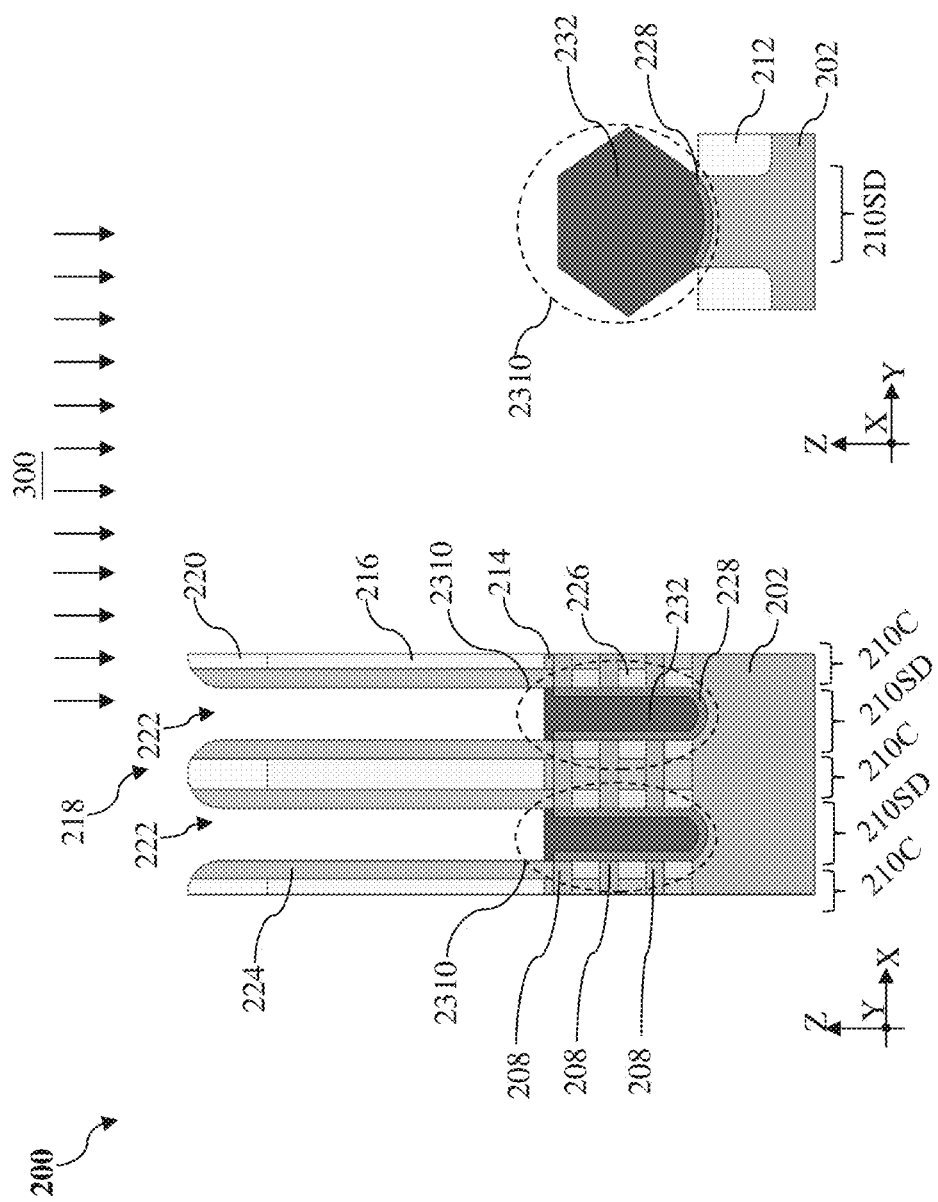

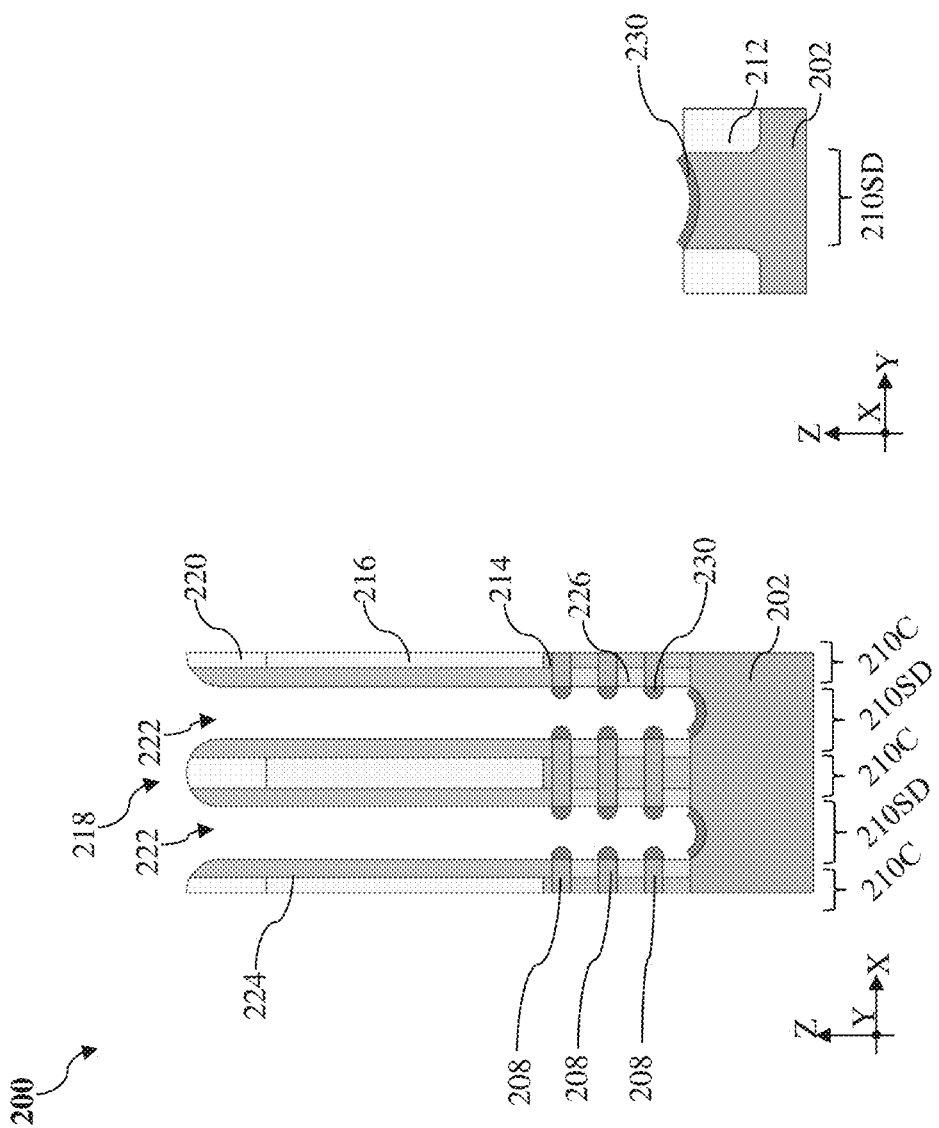

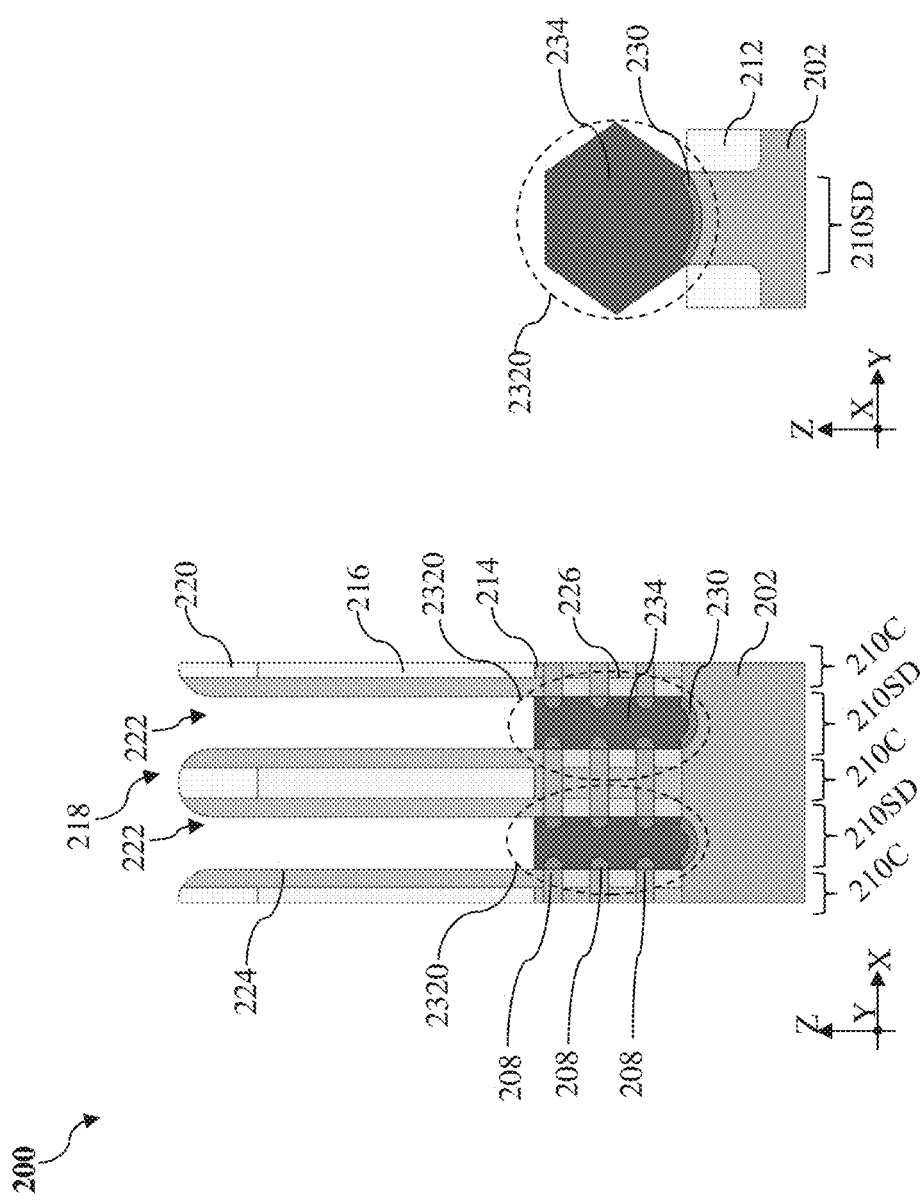

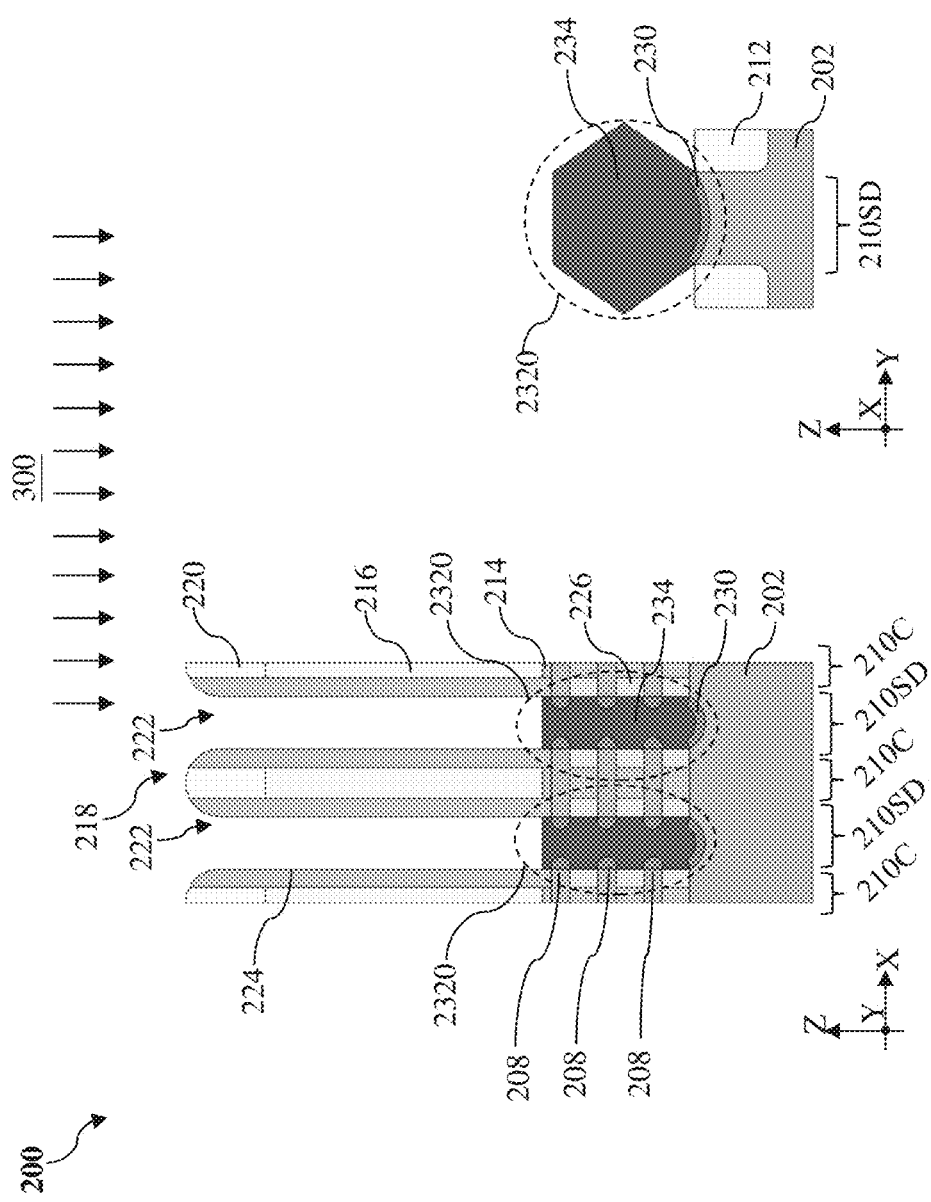

PMOSFET SOURCE DRAIN

PRIORITY DATA

This application claims priority to U.S. Provisional Patent Application No. 63/010,834 filed on Apr. 16, 2020, entitled "PMOSFET SOURCE DRAIN", the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures.

Germanium has greater hole mobility than silicon and researches have been done on using germanium to form channel members of an MBC transistor. The fact that germanium has greater dielectric constant than silicon creates challenges.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-16A, 2B-10B, and 12B-14B illustrate fragmentary cross-sectional views of a workpiece during a fabrication process according to the method of FIG. 1, according to one or more aspects of the present disclosure.

DETAILED DESCRIPTION

Figure 1:
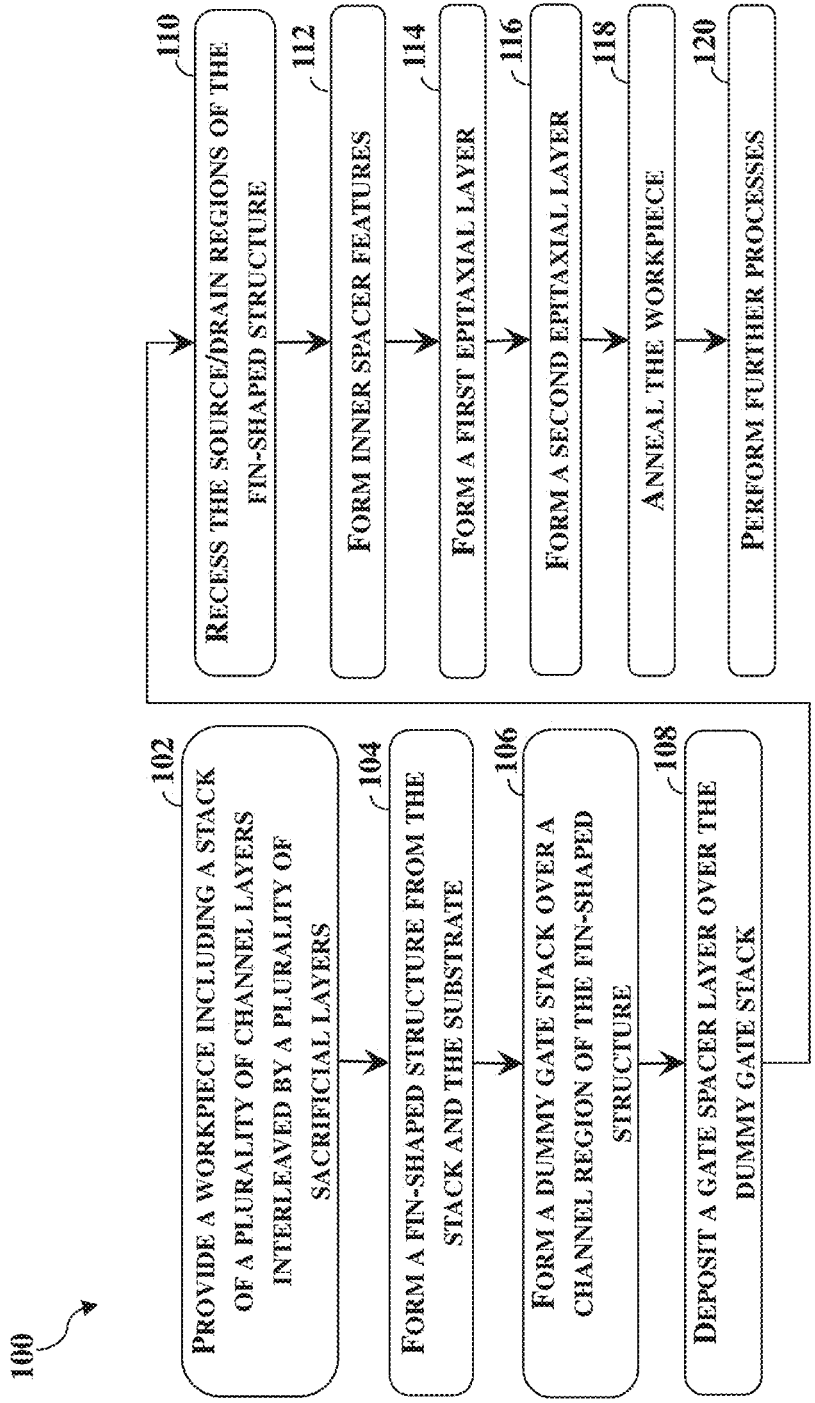
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to p-type multi-gate transistors having germanium channel members and multilayer source/drain feature for improved performance.

Multi-gate devices include transistors whose gate structures are formed on at least two-sides of a channel region. Examples of multi-gate devices include fin-like field effect transistors (FinFETs) having fin-like structures and MBC transistors having a plurality of a channel members. As described above, MBC transistors may also be referred to as SGTs, GAA transistors, nanosheet transistors, or nanowire transistors. An MBC transistor includes any device that has its gate structure, or portion thereof, formed on 4-sides of a channel region (e.g., surrounding a portion of a channel region). MBC devices according to the present disclosure may have channel regions disposed in nanowire channel members, bar-shaped channel members, nanosheet channel members, nanostructure channel members, column-shaped channel members, post-shaped channel members, and/or other suitable channel configurations. MBC transistors may be either n-type or p-type. While silicon channel members may be implemented in an p-type MBC transistor, germanium channel members are being investigated as the hole mobility in germanium is about 4 times of the hole mobility in silicon. In addition to necessary changes to channel member formation processes to accommodate germanium, the fact that the dielectric constant of germanium (about 16, as opposed to about 12 for silicon) is greater than that of silicon also poses challenges. The greater dielectric constant of germanium may lead to worse short channel effects (SCEs) and increased leakage. To address or to alleviate the short channel effects, an abrupt junction dopant profile between the channel members and source/drain features is desired. At the same time, high dopant concentrations in the source/drain features are needed to reduce parasitic resistance. If dopants in the source/drain features are allowed to diffuse too much into the channel member, the abrupt junction dopant profile may be eliminated, leading to worse SCEs and increased leakage.

The present disclosure provides embodiments of a semiconductor device where its source/drain feature includes an outer epitaxial layer to interface a channel member and an inner epitaxial feature spaced apart from the channel member. The outer epitaxial layer serves as diffusion retardation layer to reduce or block diffusion of dopants from the inner epitaxial feature into the channel member. The inner epitaxial feature and the outer epitaxial layer may be formed of different semiconductor layers or of a semiconductor material doped with different dopants. In one embodiment, the outer epitaxial layer is formed of germanium (Ge) doped with boron (B) while the inner epitaxial feature is formed of germanium (Ge) doped with gallium (Ga). In other embodiments, the germanium (Ge) in the outer epitaxial layer or the inner epitaxial layer may be replaced with germanium tin (GeSn) to introduce compressive stress. Because boron has lower diffusivity in germanium than gallium and gallium has a greater activation in germanium, the semiconductor device according to the present disclosure may demonstrate good short channel control and reduced parasitic resistance.

The various aspects of the present disclosure will now be described in more detail with reference to the figures. In that regard, FIG. 1 is a flowchart illustrating a method 100 of forming a semiconductor device from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIGS. 2A-16A, 2B-10B, and 12B-14B, which are fragmentary cross-sectional views of the semiconductor device at different stages of fabrication according to embodiments of the method 100 in FIG. 1. For better illustration of various aspects of the present disclosure, each of the figures ending with the capital letter A, such as FIGS. 2A-16A, illustrates a fragmentary perspective view of the workpiece 200 (or the semiconductor device 200) along the Y direction or the gate length direction. Each of the figures ending with capital letter B, such as FIGS. 2B-10B and 12B-14B, illustrates a fragmentary cross-sectional view of the workpiece 200 along the X direction or the channel length direction. For avoidance, the X, Y and Z directions in FIGS. 2A-16A, 2B-10B, and 12B-14B are perpendicular to one another.

Referring to FIGS. 1, 2A and 2B, method 100 includes a block 102 where a stack 204 of alternating semiconductor layers is formed over the workpiece 200. Because the workpiece 200 will be fabricated into a semiconductor device, the workpiece 200 may be referred to herein as a semiconductor device 200 as the context requires. As shown in FIGS. 2A and 2B, the workpiece 200 includes a substrate 202. In some embodiments, the substrate 202 may be a semiconductor substrate such as a silicon substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenide (As). The suitable doping may include ion implantation of dopants and/or diffusion processes. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the epitaxial layers 206 include silicon germanium (SiGe) and the epitaxial layers 208 include germanium (Ge). In some alternative embodiments, both epitaxial layers 206 and the epitaxial layers 208 include silicon germanium and a germanium content of the epitaxial layers 206 is greater than a germanium content of the epitaxial layers 208. It is noted that three (3) layers of the sacrificial layers 206 and three (3) layers of the channel layers 208 are alternately arranged as illustrated in FIGS. 2A and 2B, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel region(s) for a subsequently-formed multi-gate device and the thickness of each of the sacrificial layers 206 is chosen based on device performance considerations.

The layers in the stack 204 may be deposited using a molecular beam epitaxy (MBE) process, a metalorganic chemical vapor deposition (MOCVD) process, and/or other suitable epitaxial growth processes. As stated above, in at least some examples, the sacrificial layers 206 include an epitaxially grown silicon germanium (SiGe) layer and the channel layers 208 include an epitaxially grown germanium (Ge) layer. In some embodiments, the sacrificial layers 206 and the channel layers 208 are substantially dopant-free (i.e., having an extrinsic dopant concentration from about $0$ cm$^{-3}$ to about $1 \times 10^{17}$ cm$^{-3}$), where for example, no intentional doping is performed during the epitaxial growth processes for the stack 204.

Referring still to FIGS. 1, 2A and 2B, method 100 includes a block 104 where a fin-shaped structure 210 is formed from the stack 204 and the substrate 202. Although not shown, a hard mask layer may be deposited over the stack 204 to form an etch mask. The hard mask layer may be a single layer or a multi-layer. For example, the hard mask layer may include a pad oxide layer and a pad nitride layer over the pad oxide layer. The fin-shaped structure 210 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIGS. 2A and 2B, the etch process at block 104 forms trenches extending through the stack 204 and a portion of the substrate 202. The trenches define the fin-shaped structures 210 (one shown in FIG. 2B). In some implementations, double-patterning or multi-patterning processes may be used to define fin-shaped structures that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the fin-shaped structure 210 by etching the stack 204. As shown in FIGS. 2A and 2B, the fin-shaped structure 210, along with the sacrificial layers 206 and the channel layers 208 therein, extends lengthwise along the X direction.

An isolation feature 212 is formed adjacent the fin-shaped structure 210. In some embodiments, the isolation feature 212 may be formed in the trenches to isolate the fin-shaped structures 210 from a neighboring active region. The isolation feature 212 may also be referred to as a shallow trench isolation (STI) feature 212. By way of example, in some embodiments, a dielectric layer is first deposited over the substrate 202, filling the trenches with the dielectric layer. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 212. The fin-shaped structure 210 rises above the STI feature 212 after the recessing.

Referring to FIGS. 1, 3A, 3B, 4A, and 4B method 100 includes a block 106 where a dummy gate stack 218 is formed over a channel region 210C of the fin-shaped structure 210. In some embodiments, a gate replacement process (or gate-last process) is adopted where the dummy gate stack 218 (shown in FIG. 4A) serves as a placeholder to undergo various processes and is to be removed and replaced by the functional gate structure. Other processes and configuration are possible. In some embodiments illustrated in FIG. 4A, the dummy gate stack 218 is formed over the fin-shaped structure 210 and the fin-shaped structure 210 may be divided into channel regions 210C underlying the dummy gate stacks 218 and source/drain regions 210SD that do not underlie the dummy gate stacks 218. The channel regions 210C are adjacent the source/drain regions 210SD. As shown in FIG. 4A, the channel region 210C is disposed between two source/drain regions 210SD.

The formation of the dummy gate stack 218 may include deposition of layers in the dummy gate stack 218 and patterning of these layers. Referring to FIGS. 3A and 3B, a dummy dielectric layer 214, a dummy electrode layer 216, and a gate-top hard mask layer 220 may be blanketly deposited over the workpiece 200. In some embodiments, the dummy dielectric layer 214 may be deposited on the fin-shaped structure 210 using a chemical vapor deposition (CVD) process, an ALD process, or other suitable processes. In some instances, the dummy dielectric layer 214 may include silicon oxide. Thereafter, the dummy electrode layer 216 may be deposited over the dummy dielectric layer 214 using a CVD process, an ALD process, or other suitable processes. In some instances, the dummy electrode layer 216 may include polysilicon. For patterning purposes, the gate-top hard mask layer 220 may be deposited on the dummy electrode layer 216 using a CVD process, an ALD process, or other suitable processes. The gate-top hard mask layer 220, the dummy electrode layer 216 and the dummy dielectric layer 214 may then be patterned to form the dummy gate stack 218, as shown in FIG. 4A. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 220 may include a silicon oxide layer and a silicon nitride layer. FIG. 4B illustrates a cross-sectional view of the workpiece 200 viewed along the X direction at the source/drain region 210SD. As shown in FIG. 4B, no dummy gate stack 218 is disposed over the source/drain region 210SD of the fin-shaped structure 210.

Referring to FIGS. 1, 5A and 5B, method 100 includes a block 108 where a gate spacer layer 224 is deposited over the dummy gate stack 218. In some embodiments, the gate spacer layer 224 is deposited conformally over the workpiece 200, including over top surfaces and sidewalls of the dummy gate stack 218. The term "conformally" may be used herein for ease of description of a layer having substantially uniform thickness over various regions. The gate spacer layer 224 may have a single-layer construction or include multiple layers. In some embodiments represented in FIGS. 5A and 5B, the gate spacer layer 224 may include silicon carbonitride, silicon oxycarbide, silicon oxycarbonitride, or silicon nitride. The gate spacer layer 224 may be deposited over the dummy gate stack 218 using processes such as, a CVD process, a subatmospheric CVD (SACVD) process, an ALD process, or other suitable process. While not shown in FIGS. 5A and 5B, the gate spacer layer 224 may then be etched back in an anisotropic etch process to remove gate spacer layer 224 over top-facing surfaces of the gate-top hard mask layer 220 and the fin-shaped structure 210. That is, the etch back leaves behind gate spacer layers 224 along sidewalls of the dummy gate stack 218 and expose top surfaces of the source/drain region 210SD.

Referring to FIGS. 1, 6A and 6B, method 100 includes a block 110 where a source/drain region 210SD of the fin-shaped structure 210 is recessed to form a source/drain trench 222. In some embodiments, the source/drain regions 210SD that are not covered by the dummy gate stack 218 and the gate spacer layer 224 are etched by a dry etch or a suitable etching process to form the source/drain trenches 222. For example, the dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or CHBR3), an iodine-containing gas, other suitable gases and/or plasmas, and/or combinations thereof. In some embodiments represented in FIG. 6A, the source/drain regions 210SD of the fin-shaped structure 210 are recessed to expose sidewalls of the sacrificial layers 206 and the channel layers 208. In some implementations, the source/drain trenches 222 extend below the stack 204 into the substrate 202. FIG. 6B illustrates a cross-sectional view of the workpiece 200 viewed along the X direction at the source/drain region 210SD. As shown in FIG. 6B, the sacrificial layers 206 and channel layers 208 in the source/drain region 210SD are removed at block 110, exposing the substrate 202.

Referring to FIGS. 1, 7A and 7B, method 100 includes a block 112 where inner spacer features 226 are formed. While not shown explicitly, operation at block 112 may include selective and partial removal of the sacrificial layers 206 to form inner spacer recesses, deposition of inner spacer material over the workpiece, and etch back the inner spacer material to form inner spacer features 226 in the inner spacer recesses. The sacrificial layers 206 exposed in the source/drain trenches 222 (shown in FIG. 6A) are selectively and partially recessed to form inner spacer recesses (occupied by the inner spacer features 226 in FIG. 7A) while the gate spacer layer 224, the exposed portion of the substrate 202, and the channel layers 208 are substantially unetched. In an embodiment where the channel layers 208 consist essentially of germanium (Ge) and sacrificial layers 206 consist essentially of silicon germanium (SiGe), the selective recess of the sacrificial layers 206 may be performed using a selective wet etch process or a selective dry etch process. An example selective wet etch process may include use of a TMAH (tetramethylammonium hydroxide) solution and a process temperature between about 90° C. and about 100° C.

The inner spacer material for the inner spacer features 226 may include metal oxides, silicon oxide, silicon oxycarbonitride, silicon nitride, silicon oxynitride, carbon-rich silicon carbonitride, or a low-k dielectric material. The metal oxides here may include aluminum oxide, zirconium oxide, tantalum oxide, yttrium oxide, titanium oxide, lanthanum oxide, or other suitable metal oxide. While not explicitly shown, the inner spacer material may be a single layer or a multi-layer. In some implementations, the inner spacer material for the inner spacer features 226 may be deposited using CVD, PECVD, SACVD, ALD or other suitable methods. The inner spacer material for the inner spacer features 226 is deposited into the inner spacer recesses as well as over the sidewalls of the channel layers 208 exposed in the source/drain trenches 222. The deposited inner spacer material is then etched back to remove the inner spacer material from the sidewalls of the channel layers 208 to form the inner spacer features 226 in the inner spacer recesses. At block 112, the inner spacer material may also be removed from the top surfaces and/or sidewalls of the gate-top hard mask layer 220, the gate spacer layer 224, and the isolation features 212. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 7A, each of the inner spacer features 226 is in direct contact with the recessed sacrificial layers 206 and is disposed between two neighboring channel layers 208.

Referring to FIGS. 1, 8A and 8B, method 100 includes a block 114 where a first outer epitaxial feature 228 is formed in the source/drain trench 222. In some implementations, the first outer epitaxial feature 228 may be epitaxially and selectively formed from the exposed sidewalls of the channel layers 208 and exposed surfaces of the substrate 202. Sidewalls of the sacrificial layers 206 remain covered by the first outer epitaxial features 228. Suitable epitaxial processes for block 114 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process at block 112 may use gaseous and/or liquid precursors, which interact with the composition of the substrate 202 as well as the channel layers 208. In some embodiments, parameters of the epitaxial growth process at block 112 are selected such that the first outer epitaxial feature 228 is not epitaxially deposited on the inner spacer features 226. In some instances, the first outer epitaxial feature 228 includes germanium (Ge) doped with a first p-type dopant. The first outer epitaxial feature 228 serves as a diffusion barrier layer or diffusion barrier layer and the first p-type dopant has a diffusivity in germanium smaller than that of gallium (Ga). The first p-type dopant may be boron (B). In other instances, the first outer epitaxial feature 228 includes germanium tin (GeSn) doped with the first p-type dopant. Due to the larger lattice constant of tin as compared to that of germanium, germanium atoms in the alloy semiconductor of germanium tin (GeSn) may be compressively strained for improved hole mobility. In some implementations, the first outer epitaxial feature 228 may have a thickness between about 1 nm and about 6 nm and a doping concentration of the first p-type dopant may be between about $5 \times 10^{19}$ atoms/$cm^3$ and about $5 \times 10^{20}$ atoms/$cm^3$. When the doping concentration of the first p-type dopant is lower than $5 \times 10^{19}$ atoms/$cm^3$, the resistance in the first outer epitaxial feature 228 may prevent satisfactory drive current (i.e., On-state current). Moreover, solubility of the first p-type dopant in germanium may prevent the doping concentration of the first p-type dopant to exceed $5 \times 10^{20}$ atoms/$cm^3$. As shown in FIG. 8A, the first outer epitaxial feature 228 is allowed to coalesce and merge over the inner spacer features 226 such that the first outer epitaxial feature 228 is contiguous from one channel layer 208 to another channel layer 208. The first outer epitaxial feature 228 may also be referred to as a first outer epitaxial layer 228 or a first outer liner 228.

In some alternative embodiments represented in FIGS. 12A and 12B, a second outer epitaxial feature 230, rather than the first outer epitaxial feature 228, are epitaxially grown from the exposed channel layers 208 and the substrate 202 but do not coalesce to merge over the inner spacer features 226. The second outer epitaxial feature 230 may also be referred to as a second outer epitaxial layer 230 or a second outer liner 230. As shown in FIGS. 8A and 12A, one of the differences between the first outer liner 228 and the second outer liner 230 is whether over-growth of the first outer liner 228 and the second outer liner 230 is allowed to cover the inner spacer features 226.

Referring to FIGS. 1, 9A and 9B, method 100 includes a block 116 where a first inner epitaxial feature 232 is formed over the first outer epitaxial feature 228. In some embodiments, the first inner epitaxial feature 232 may be epitaxially and selectively formed from the first outer epitaxial feature 228. Suitable epitaxial processes for block 122 include CVD deposition techniques (e.g., vapor-phase epitaxy (VPE) and/or ultra-high vacuum CVD (UHV-CVD)), molecular beam epitaxy (MBE), and/or other suitable processes. The epitaxial growth process at block 116 may use gaseous and/or liquid precursors, which interact with the composition of the first outer epitaxial feature 228. In some embodiments, parameters of the epitaxial growth process at block 116 are selected such that the first inner epitaxial feature 232 is not epitaxially grown from on the inner spacer features 226 even though the first inner epitaxial feature 232 may overgrow to cover or come in contact with the inner spacer features 226. In some instances, the first inner epitaxial feature 232 includes germanium (Ge) doped with a second p-type dopant different from the first p-type dopant. The first inner epitaxial feature 232 serves as a low resistance layer (or a high electrical conductivity layer) and the second p-type dopant has a dopant activation level in germanium greater than that of boron (B). Here, greater dopant activation level leads to decreased resistance and increased electrical conductivity. The second p-type dopant may be gallium (Ga). In other instances, the first inner epitaxial feature 232 includes germanium tin (GeSn) doped with the second p-type dopant. Due to the larger lattice constant of tin as compared to that of germanium, germanium atoms in the alloy semiconductor of germanium tin (GeSn) may be compressively strained for improved hole mobility. In some embodiments, the first inner epitaxial feature 232 may have a thickness between about 1 nm and about 6 nm and a doping concentration of the second p-type dopant may be between about $3 \times 10^{20}$ atoms/cm$^3$ and about $1 \times 10^{21}$ atoms/cm$^3$. When the doping concentration of the second p-type dopant in the first inner epitaxial feature 232 is lower than $3 \times 10^{20}$ atoms/cm$^3$, the first inner epitaxial feature 232 may not be sufficiently conductive to achieve satisfactory drive current (i.e., On-state current). Moreover, solubility of the second p-type dopant in germanium may prevent the doping concentration of the second p-type dopant to exceed $1 \times 10^{21}$ atoms/cm$^3$. In some embodiments represented in FIGS. 9A and 9B, the first inner epitaxial feature 232 is separated or spaced apart from the channel layers 208, the inner spacer features 226, and the substrate 202 by the first outer epitaxial feature 228. The first inner epitaxial feature 232 may also be referred to as a first inner epitaxial layer 232 or a first inner filler 232. The first outer epitaxial feature 228 and the first inner epitaxial feature 232 may be regarded collectively as a first source/drain feature 2310 that is disposed over the source/drain regions 210SD.

It is noted that both boron (B) and gallium (Ga) are elements found in Group IIIA of the element table. Boron (B) has an atomic mass (or atomic weight) of 10.811 u and gallium (Ga) has an atomic mass (or atomic weight) of 67.723 u. The atomic mass of gallium (Ga) is greater than the atomic mass of boron (B).

In some alternative embodiments represented in FIGS. 13A and 13B, when the second outer epitaxial feature 230 is implemented at block 114, block 116 of method 100 may deposit a second inner epitaxial feature 234 over the second outer epitaxial feature 230. As shown in FIG. 13A, the second inner epitaxial feature 234 may be in contact with the inner spacer features 226 but is spaced apart from the channel layers 208 by the second outer epitaxial feature 230.

The second inner epitaxial feature 234 may also be referred to as a second inner epitaxial layer 234 or a second inner filler 234. The second outer epitaxial feature 230 and the second inner epitaxial feature 234 may be regarded collectively as a second source/drain feature 2320 that is disposed over the source/drain regions 210SD. As shown in FIGS. 9A and 13A, one of the differences between the first inner filler 232 and the second inner filler 234 lies in that the second inner filler 234 is allowed to come in contact with the inner spacer features 226 but the first inner filler 232 is not.

Although not explicitly shown in FIG. 9A, 9B, 13A, or 13B, a top epitaxial feature may be deposited over the first inner epitaxial feature 232 or the second inner epitaxial feature 234 in some alternative embodiments. In these alternative embodiments, the top epitaxial feature may have a composition similar to that of the first inner epitaxial feature 232 or the second inner epitaxial feature 234 but have a doping concentration greater than that of the first inner epitaxial feature 232 or the second inner epitaxial feature 234. The top epitaxial feature may serve to further reduce contact resistance.

According to aspects of the present disclosure, the first outer epitaxial feature 228 or the second outer epitaxial feature 230, doped with the first p-type dopant, serves as a diffusion barrier layer that prevents or blocks diffusion of the second p-type dopant, such as gallium (Ga) from the first inner epitaxial feature 232 or the second inner epitaxial feature 234 into the channel layers 208 and the substrate 202. As compared boron, gallium has greater diffusivity in germanium and is more likely to compromise short channel control and result in leakage.

Referring to FIGS. 1, 10A, 10B, 14A, and 14B, method 100 includes a block 118 where the workpiece 200 is annealed in an anneal process 300 to activate the first p-type dopant and the second p-type dopant. In some implementation, the anneal process 300 may include a rapid thermal anneal (RTA) process, a laser spike anneal process, a flash anneal process, or a furnace anneal process. The anneal process 300 may include a peak anneal temperature between about 900° C. and about 1000° C. In these implementations, the peak anneal temperature may be maintained for a duration measured by seconds or microseconds. Through the anneal process 300, a desired electronic contribution from the first p-type dopant and the second p-type dopant in the semiconductor host, such as germanium (Ge) or germanium tin (GeSn), may be obtained. The anneal process 300 may generate vacancies that facilitate movement of the first p-type dopant and the second p-type dopant from interstitial sites to substitutional lattice sites and reduce damages or defects in the lattice of the semiconductor host.

Figure 11A:
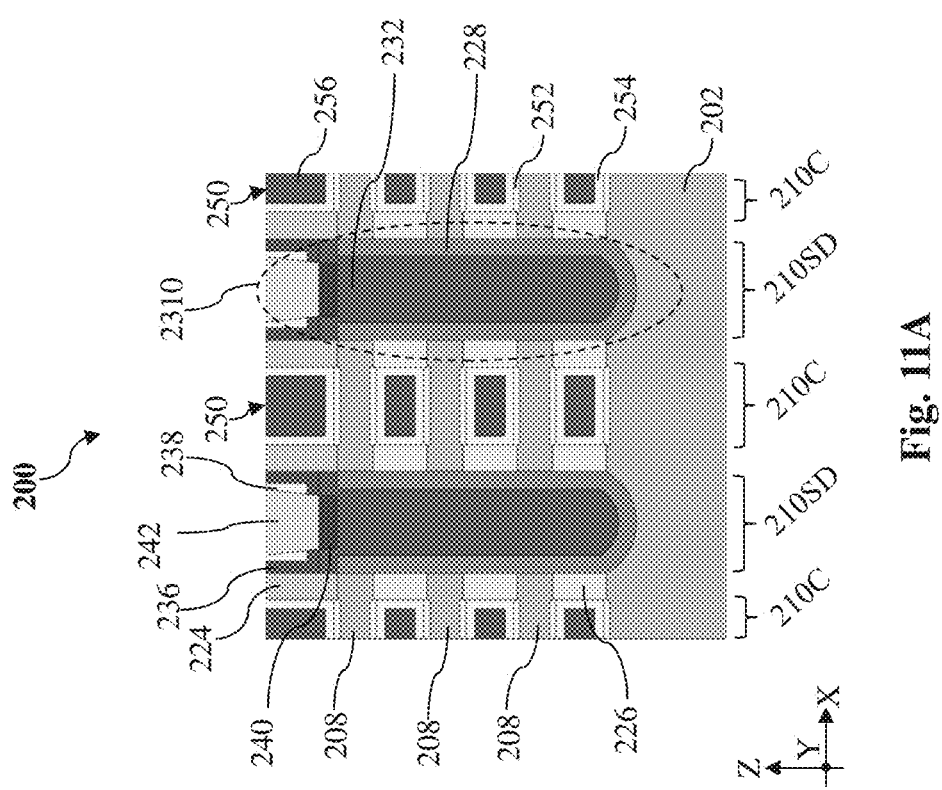
Figure 15A:
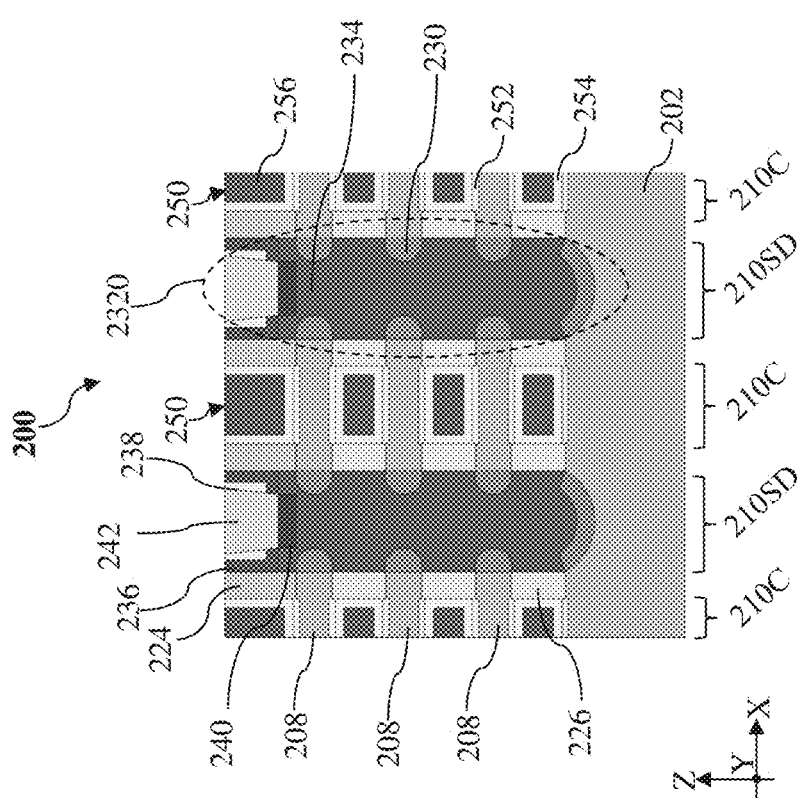

Referring to FIGS. 1, 11A and 15A, method 100 includes a block 120 where further processes are performed. Such further processes may include, for example, deposition of a contact etch stop layer (CESL) 236 over the workpiece 200, deposition of an interlayer dielectric (ILD) layer 238 over the CESL 236, removal of the dummy gate stack 218, selective removal of the sacrificial layers 206 in the channel region 210C to release the channel layers 208 as channel members, formation of a gate structure 250 over the channel region 210C, formation of a source/drain contact opening through the CESL 236 and the ILD layer 238, formation of a germanide feature 240, and a source/drain contact 242. Referring now to FIGS. 11A and 15A, the CESL 236 is formed prior to forming the ILD layer 238. In some examples, the CESL 236 includes a silicon nitride layer, a silicon oxide layer, a silicon oxynitride layer, and/or other materials known in the art. The CESL 236 may be formed by ALD, plasma-enhanced chemical vapor deposition (PECVD) process and/or other suitable deposition or oxidation processes. The ILD layer 238 is then deposited over the CESL 236. In some embodiments, the ILD layer 238 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 238 may be deposited by a PECVD process or other suitable deposition technique. In some embodiments, after formation of the ILD layer 238, the workpiece 200 may be annealed to improve integrity of the ILD layer 238. As shown in FIGS. 11A and 15A, the CESL 236 may be disposed directly on top surfaces of the first inner epitaxial feature 232 or the second inner epitaxial feature 234.

After the deposition of the CESL 236 and the ILD layer 238, the workpiece 200 may be planarized by a planarization process to expose the dummy gate stack 218 (shown in FIGS. 10A and 14A). For example, the planarization process may include a chemical mechanical planarization (CMP) process. Exposure of the dummy gate stack 218 allows the removal of the dummy gate stack 218 and release of the channel layers 208. In some embodiments, the removal of the dummy gate stack 218 results in a gate trench over the channel regions 210C. The removal of the dummy gate stack 218 may include one or more etching processes that are selective to the material of the dummy gate stack 218. For example, the removal of the dummy gate stack 218 may be performed using as a selective wet etch, a selective dry etch, or a combination thereof that is selective to the dummy gate stack 218. After the removal of the dummy gate stack 218, sidewalls of the channel layers 208 and the sacrificial layers 206 in the channel region 210C are exposed in the gate trench.

After the removal of the dummy gate stack 218, the method 100 may include operations to selectively remove the sacrificial layers 206 between the channel layers 208 in the channel region 210C. The selective removal of the sacrificial layers 206 releases the channel layers 208 to form channel members 208. It is noted that the same reference numeral 208 is used to denote channel members 208 for simplicity. The selective removal of the sacrificial layers 206 may be implemented by selective dry etch, selective wet etch, or other selective etch processes. An example selective wet etch process may include use of a TMAH (tetramethylammonium hydroxide) solution and a process temperature between about 90° C. and about 100° C.

The method 100 may include further operations to form the gate structure 250 to wrap around each of the released channel layers 208. In some embodiments, the gate structure 250 is formed within the gate trench and into the space left behind by the removal of the sacrificial layers 206. In this regard, the gate structure 250 wraps around each of the channel members 208. In various embodiments, the gate structure 250 includes an interfacial layer 252, a high-K gate dielectric layer 254 formed over the interfacial layer 252, and/or a gate electrode layer 256 formed over the high-K gate dielectric layer 254. High-K dielectric materials, as used and described herein, include dielectric materials having a high dielectric constant, for example, greater than that of thermal silicon oxide (~3.9).

In some embodiments, the interfacial layer 252 of the gate structure 250 may include a dielectric material such as silicon oxide, hafnium silicate, or silicon oxynitride. The interfacial layer 252 may be formed by chemical oxidation, thermal oxidation, atomic layer deposition (ALD), chemical vapor deposition (CVD), and/or other suitable method. The high-K gate dielectric layer 254 of the gate structure 250 may include hafnium oxide. Alternatively, the high-K gate dielectric layer 254 of the gate structure 250 may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material. The high-K gate dielectric layer 254 may be formed by ALD, physical vapor deposition (PVD), CVD, oxidation, and/or other suitable methods.

The gate electrode layer 256 of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 256 of the gate structure 250 may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer 256 of the gate structure 250 may be formed by ALD, PVD, CVD, e-beam evaporation, or other suitable process. Further, the gate electrode layer 256 may be formed separately for N-FET and P-FET transistors which may use different metal layers (e.g., for providing different n-type and p-type work function metal layers). In various embodiments, a CMP process may be performed to remove excessive metal, thereby providing a substantially planar top surface of the gate structure 250. The gate structure 250 includes portions that interpose between channel members 208 in the channel region 210C.

To form electric connection to the first source/drain feature 2310 shown in FIG. 11A or the second source/drain feature 2320 shown in FIG. 15A, a source/drain opening is first formed through the ILD layer 238 and the CESL 236 to expose the first source/drain feature 2310 or the second source/drain feature 2320. A metal is then deposited over the exposed first source/drain feature 2310 or second source/drain feature 2320. The workpiece 200 is annealed to cause a germanidation reaction between the deposited metal and the first source/drain feature 2310 or second source/drain feature 2320 to form the germanide feature 240. In some implementation, the metal for germanidation may include titanium, tantalum, nickel, cobalt, or tungsten and the germanide feature 240 may include titanium germanide, tantalum germanide, nickel germanide, cobalt germanide, or tungsten germanide. After the formation of the germanide feature 240, tungsten (W), titanium (Ti), titanium nitride (TiN), ruthenium (Ru), cobalt (Co), nickel (Ni), or copper (Cu) may be deposited in the source/drain opening and planarized to form the source/drain contact 242. In some embodiments, a barrier layer may be deposited in the source/drain opening before the deposition of the source/drain contact 242. An example barrier layer may include titanium nitride, tantalum nitride, titanium silicon nitride, or cobalt nitride.

A semiconductor device 200 is substantially formed as illustrated in FIGS. 11A and 15A. Referring first FIG. 11A, the semiconductor device 200 includes two first source/drain features 2310, channel members 208 extending between the two first source/drain features 2310, and a gate structure 250 wrapping around each of the channel members 208. The channel members 208 are also interleaved by inner spacer features 226. The inner spacer features 226 isolate the gate structure 250 from the two first source/drain features 2310. Each of the first source/drain features 2310 includes the first outer epitaxial feature 228 and the first inner epitaxial feature 232. The channel members 208 are coupled to the first outer epitaxial feature 228 but are spaced part from the first inner epitaxial feature 232. The first outer epitaxial feature 228 merges over the inner spacer features 226 and separates the inner spacer feature 226 from the first inner epitaxial feature 232. The first outer epitaxial feature 228 serves as diffusion barrier layer to prevent the second p-type dopant in the first inner epitaxial feature 232 from diffusing into the channel members 208 or the substrate 202. As described above, the first p-type dopant in the first outer epitaxial feature 228 may include boron (B) and the second p-type dopant in the first inner epitaxial feature 232 may include gallium (Ga). The semiconductor device 200 is p-type. Depending on dimensions of the channel members 208, the semiconductor device 200 in FIG. 11A may be referred to as a p-type MBC transistor, a p-type GAA transistor, a p-type SGT, a p-type nanowire transistor, and a p-type nanosheet transistor.

Referring first to FIG. 15A, the semiconductor device 200 includes two second source/drain features 2320, channel members 208 extending between the two second source/drain features 2320, and a gate structure 250 wrapping around each of the channel members 208. The channel members 208 are also interleaved by inner spacer features 226. The inner spacer features 226 isolate the gate structure 250 from the two second source/drain features 2320. Each of the second source/drain features 2320 includes the second outer epitaxial feature 230 and the second inner epitaxial feature 234. The channel members 208 are coupled to the second outer epitaxial feature 230 but are spaced part from the second inner epitaxial feature 234. The second outer epitaxial feature 230 does not merge over the inner spacer features 226 and the inner spacer features 226 may be in contact with the second inner epitaxial feature 234. The second outer epitaxial feature 230 serves as diffusion barrier layer to prevent the second p-type dopant in the second inner epitaxial feature 234 from diffusing into the channel members 208 or the substrate 202. As described above, the first p-type dopant in the second outer epitaxial feature 230 may include boron (B) and the second p-type dopant in the second inner epitaxial feature 234 may include gallium (Ga). The semiconductor device 200 is p-type. Depending on dimensions of the channel members 208, the semiconductor device 200 in FIG. 11A may be referred to as a p-type MBC transistor, a p-type GAA transistor, a p-type SGT, a p-type nanowire transistor, and a p-type nanosheet transistor.

Figure 16A:
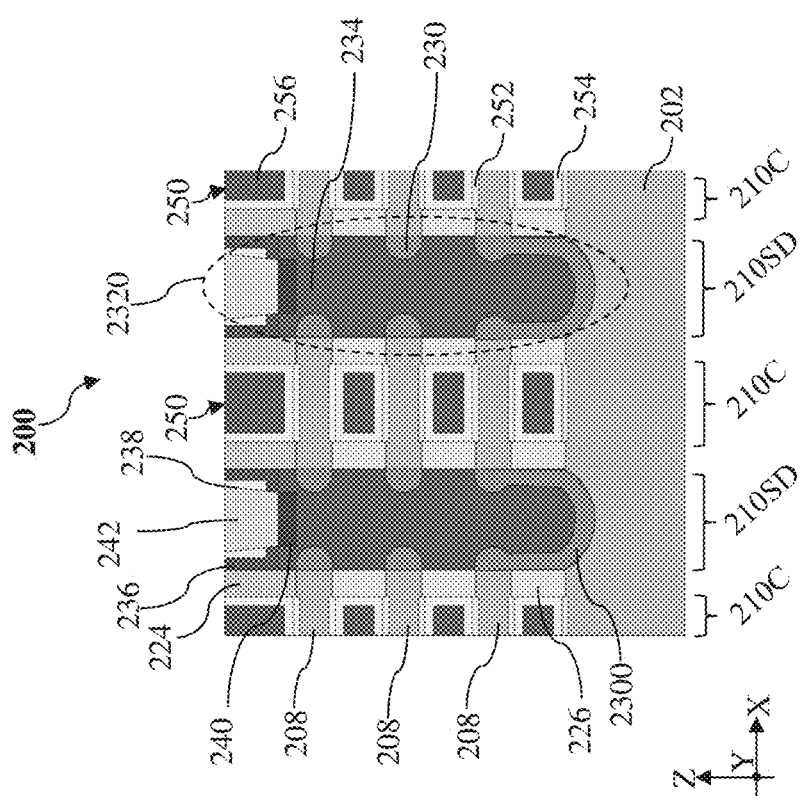

In some alternative embodiments shown in FIG. 16A, while of the second outer epitaxial features 230 do not merge over the inner spacer features 226, some lower outer epitaxial features 2300 do merge. This may be owing to the epitaxial growth from the exposed surfaces of the substrate 202. In these alternative embodiments, the lower outer epitaxial features 230 may be disposed over inner spacer features 226 that are near a bottom surface of the gate structure 250.

Figure 17:
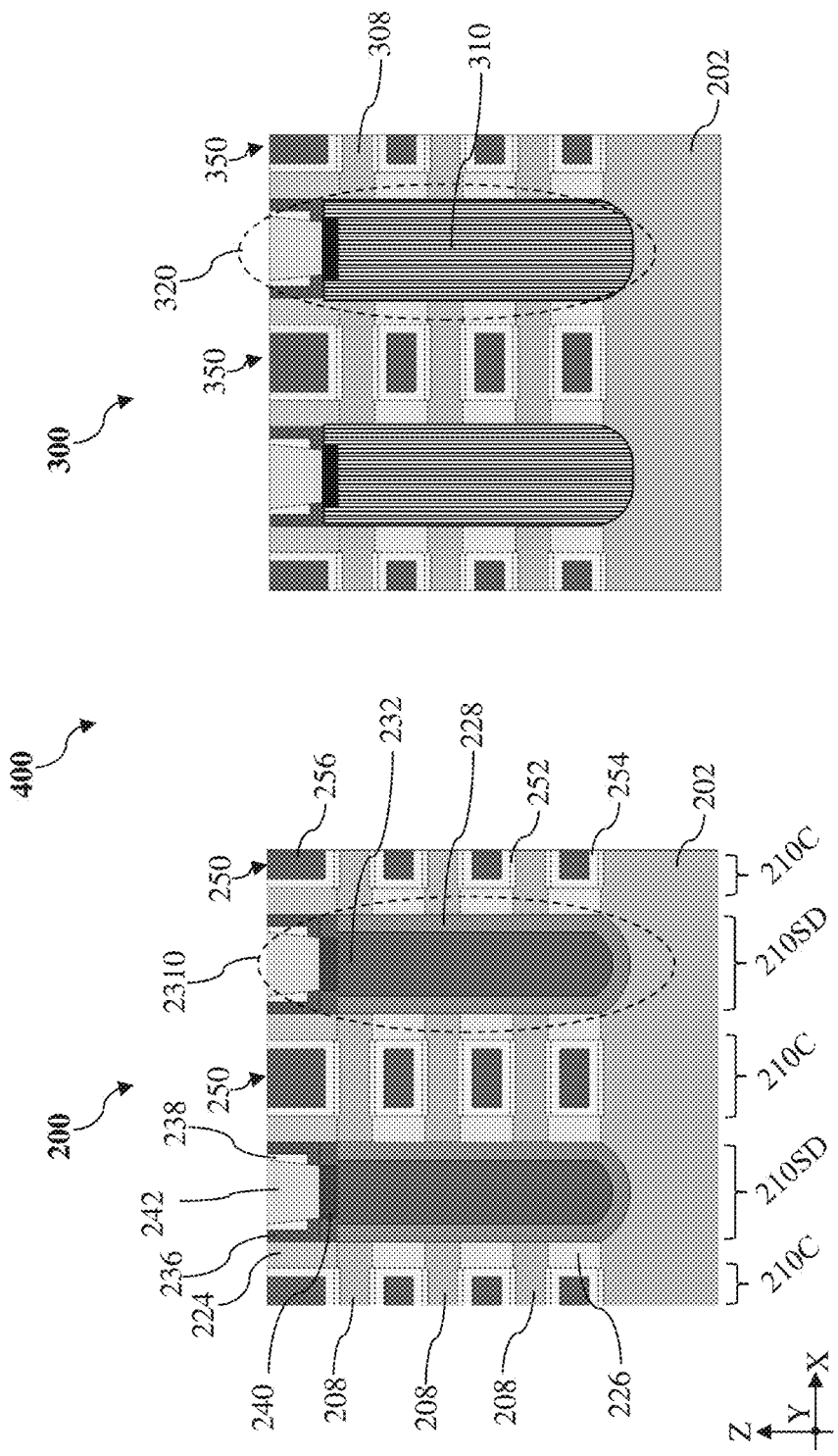
FIGS. 17-19 illustrate fragmentary cross-sectional views of a semiconductor device including different types of transistors, according to one or more aspects of the present disclosure.
Figure 18:
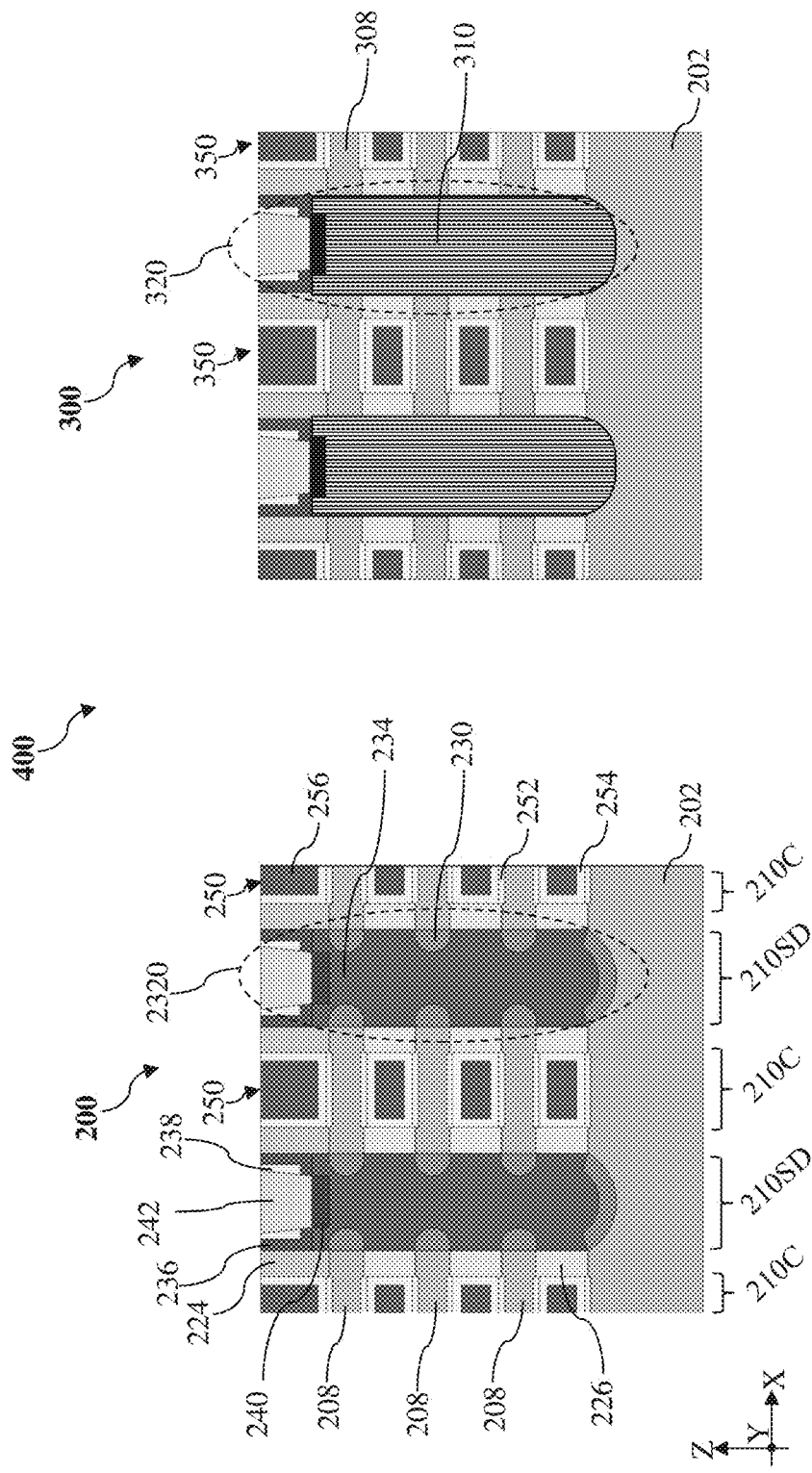
Figure 19:
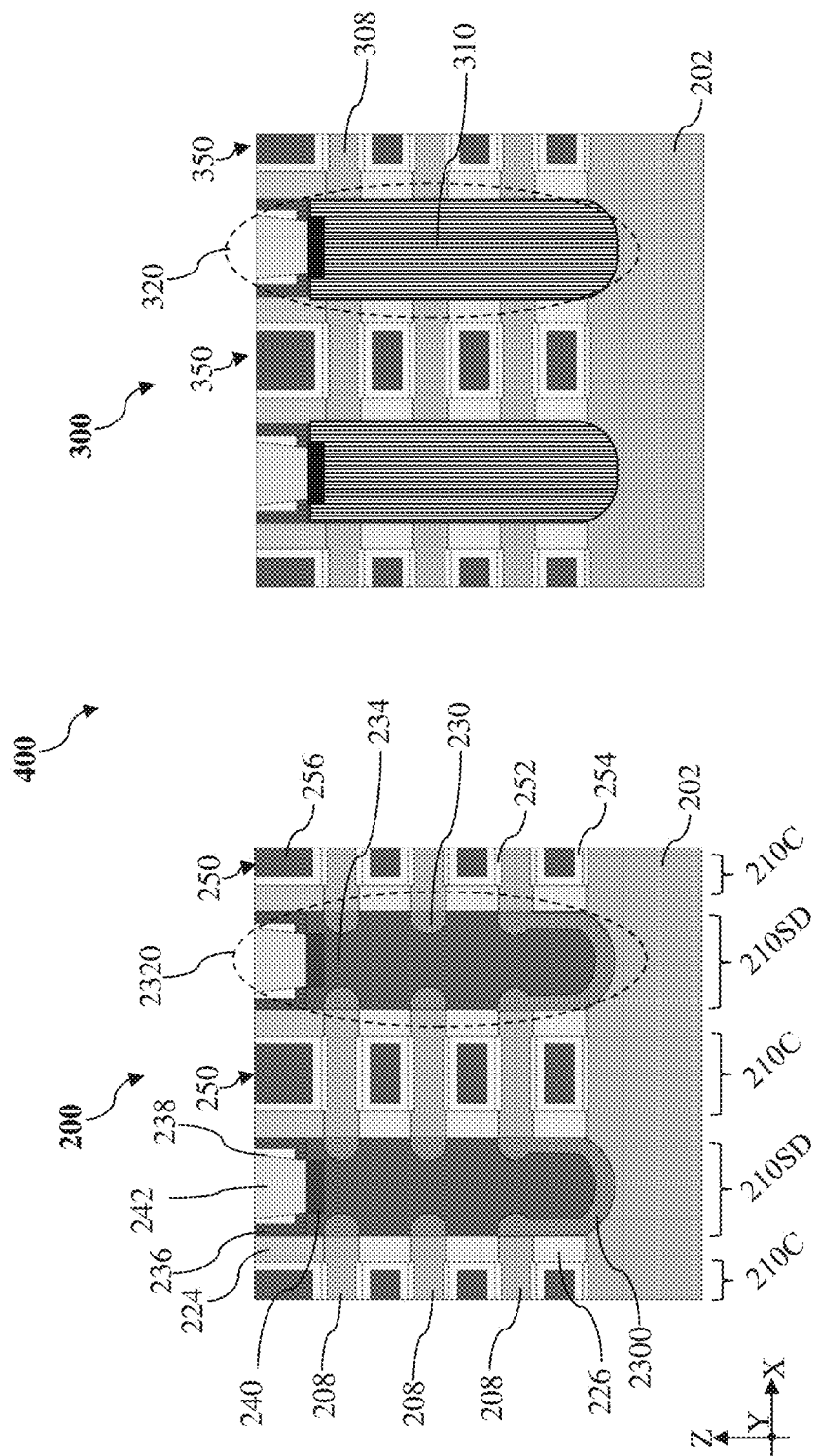

FIGS. 17, 18 and 19 illustrate embodiments where p-type MBC transistors 200 shown in FIGS. 11A, 15A and 16A and n-type MBC transistors 300 are fabricated on a workpiece 400 to form a semiconductor device. As shown in FIGS. 17, 18, and 19, with the exceptions of n-type epitaxial features 310, n-type gate structure 350, and n-type channel members 308, the n-type MBC transistors 300 share similar structures with the p-type MBC transistors 200. For that reasons, detailed description of the n-type MBC transistors 300 are omitted for brevity. In some embodiments, the n-type channel members 308 is formed of silicon and no germanium is intentionally included in the n-type channel members 308. The n-type gate structures 350 includes n-type work function layers while the gate structure 250 includes p-type work function layers. Different from the embodiments shown in FIGS. 11A, 15A and 16A, the n-type epitaxial features does not have an inner-filler/outer liner construction and may include only a single n-type dopant species, such as phosphorus (P). In some implementations, the n-type epitaxial feature may include a lower portion and an upper portion over the lower portion. In these implementations, both the lower portion and the upper portion are doped with the same n-type dopant but the upper portion may be more heavily doped than the lower portion.

Although not intended to be limiting, one or more embodiments of the present disclosure provide many benefits to a semiconductor device and the formation thereof. For example, embodiments of the present disclosure provide a p-type transistor that includes a vertical stack of the germanium channel members extending between two source/drain features. Each of the source/drain features includes an outer epitaxial feature and an inner epitaxial feature. The germanium channel members are coupled to the outer epitaxial features but are spaced apart from the inner epitaxial features. The outer epitaxial features include a first p-type dopant and the inner epitaxial features include a second p-type dopant. The diffusivity of the first p-type dopant in germanium is smaller than the diffusivity of the second p-type dopant in germanium. The dopant activation level of the second p-type dopant in germanium is greater than the dopant activation level of the first p-type dopant in germanium. The outer epitaxial feature serves as a diffusion barrier to ensure an abrupt junction dopant profile to improve short channel control and to reduce leakage. The inner epitaxial feature provides reduced parasitic resistance.

In one exemplary aspect, the present disclosure is directed to a semiconductor device. The semiconductor device includes a first source/drain epitaxial feature and a second source/drain epitaxial feature each including an outer liner layer and an inner filler layer, a plurality of channel members extending between the first source/drain epitaxial feature and the second source/drain epitaxial feature along a first direction, and a gate structure disposed over and around the plurality of channel members. The plurality of channel members are in contact with the outer liner layer and are spaced apart from the inner filler layer. The outer liner layer includes germanium and a first element and the inner filler layer includes germanium and a second element different from the first element.

In some embodiments, the first element and the second element are in group IIIA of a period table. In some implementations, an atomic weight of the second element is greater than an atomic weight of the first element. In some implementations, at least one of the outer liner layer and the inner filler layer further includes tin. In some embodiments, the semiconductor device may further include a plurality of inner spacer features and the plurality of channel members are interleaved by the plurality of inner spacer features along a second direction perpendicular to the first direction. In some embodiments, the outer liner layer is merged over the plurality of inner spacer features and the plurality of inner spacer features are spaced apart from the inner filler layer. In some instances, the outer liner layer is not merged over the plurality of inner spacer features and the plurality of inner spacer features are in contact with the inner filler layer. In some embodiments, the outer liner layer includes a boron doping concentration between about $5 \times 10^{19}$ atoms/cm$^3$ and about $5 \times 10^{20}$ atoms/cm$^3$. In some implementations, the inner filler layer includes a gallium doping concentration between about $3 \times 10^{20}$ atoms/cm$^3$ and about $1 \times 10^{21}$ atoms/cm$^3$.

In another exemplary aspect, the present disclosure is directed to a semiconductor device. The semiconductor device includes a first source/drain feature including a first outer epitaxial feature and a first inner epitaxial feature over the first outer epitaxial feature, a second source/drain feature including a second outer epitaxial feature a second inner epitaxial feature over the second outer epitaxial feature, a plurality of germanium-containing channel members extending between and in contact with the first outer epitaxial feature and the second outer epitaxial feature along a first direction, and a gate structure disposed over and around the plurality of germanium-containing channel members. The plurality of germanium-containing channel members are spaced apart from the first inner epitaxial feature and the second inner epitaxial feature. The first outer epitaxial feature and the second outer epitaxial feature include a first p-type dopant and the first inner epitaxial feature and the second inner epitaxial feature include a second p-type dopant different from the first p-type dopant.

In some embodiments, a diffusivity of the first p-type dopant in germanium is smaller than a diffusivity of the second p-type dopant in germanium. In some embodiments, an electrical conductivity of the first inner epitaxial feature and the second inner epitaxial feature is greater than an electrical conductivity of the first outer epitaxial feature and the second outer epitaxial feature. In some implementations, the first outer epitaxial feature and the second outer epitaxial feature include germanium and the first p-type dopant is boron and the first inner epitaxial feature and the second inner epitaxial feature include germanium and the second p-type dopant is gallium. In some implementations, at least one of the first outer epitaxial feature and the second outer epitaxial feature includes a plurality of portions separated from one another. In some instances, the semiconductor device may further include a top epitaxial feature disposed on the first inner epitaxial feature. In some embodiments, the plurality of germanium-containing channel members are spaced apart from one another by a plurality of inner spacer features along a second direction perpendicular to the first direction, and the first inner epitaxial feature and the second inner epitaxial feature are in contact with the plurality of inner spacer features. In some instances, the plurality of germanium-containing channel members are spaced apart from one another by a plurality of inner spacer features along a second direction perpendicular to the first direction, and the first inner epitaxial feature and the second inner epitaxial feature are spaced apart from the plurality of inner spacer features by the first outer epitaxial feature and the second outer epitaxial feature, respectively, along the first direction.

In yet another exemplary aspect, the present disclosure is directed to a method. The method includes forming a stack over a substrate, the stack including a plurality of channel layers interleaved by a plurality of sacrificial layers, forming a fin-shaped structure from the stack and the substrate, the fin-shaped structure including a channel region and a source/drain region, forming a dummy gate stack over the channel region of the fin-shaped structure, depositing a gate spacer layer over the dummy gate stack, recessing the source/drain region to form a source/drain trench that exposes sidewalls of the plurality of channel layers and the plurality of sacrificial layers, selectively and partially recessing the plurality of sacrificial layers to form a plurality of inner spacer recesses, forming a plurality of inner spacer features in the plurality of inner spacer recesses, depositing an outer epitaxial layer in the source/drain trench, the outer epitaxial layer including a first p-type dopant, depositing an inner epitaxial layer over the outer epitaxial layer, the inner epitaxial layer including a second p-type dopant different from the first p-type dopant, removing the dummy gate stack, selectively removing the plurality of sacrificial layers in the channel region, and forming a gate structure around each of the plurality of channel layers in the channel region. The plurality of channel layers include germanium and the plurality of sacrificial layers include silicon germanium.

In some embodiments, the first p-type dopant includes boron and the second p-type dopant includes gallium. In some implementations, the depositing of the outer epitaxial layer includes depositing the outer epitaxial layer over the plurality of inner spacer features.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
 a first source/drain epitaxial feature and a second source/drain epitaxial feature each comprising an outer liner layer and an inner filler layer;
 a plurality of channel members extending between the first source/drain epitaxial feature and the second source/drain epitaxial feature along a first direction; and
 a gate structure disposed over and around the plurality of channel members,
 wherein the plurality of channel members are in contact with the outer liner layer and are spaced apart from the inner filler layer,
 wherein the outer liner layer comprises germanium and a first element,
 wherein the inner filler layer comprises germanium and a second element different from the first element.

2. The semiconductor device of claim 1, wherein the first element and the second element are in group IIIA of a period table.

3. The semiconductor device of claim 1, wherein an atomic mass of the second element is greater than an atomic mass of the first element.

4. The semiconductor device of claim 1, wherein at least one of the outer liner layer and the inner filler layer further comprises tin.

5. The semiconductor device of claim 1, further comprising:
a plurality of inner spacer features, wherein the plurality of channel members are interleaved by the plurality of inner spacer features along a second direction perpendicular to the first direction.

6. The semiconductor device of claim 5, wherein the outer liner layer is merged over the plurality of inner spacer features and the plurality of inner spacer features are spaced apart from the inner filler layer.

7. The semiconductor device of claim 5, wherein the outer liner layer is not merged over the plurality of inner spacer features and the plurality of inner spacer features are in contact with the inner filler layer.

8. The semiconductor device of claim 1, wherein the outer liner layer comprises a boron doping concentration between about $5 \times 10^{19}$ atoms/cm$^3$ and about $5 \times 10^{20}$ atoms/cm$^3$.

9. The semiconductor device of claim 1, wherein the inner filler layer comprises a gallium doping concentration between about $3 \times 10^{20}$ atoms/cm$^3$ and about $1 \times 10^{21}$ atoms/cm$^3$.

10. A semiconductor device, comprising:
a first source/drain feature comprising a first outer epitaxial feature and a first inner epitaxial feature over the first outer epitaxial feature;
a second source/drain feature comprising a second outer epitaxial feature a second inner epitaxial feature over the second outer epitaxial feature;
a plurality of germanium-containing channel members extending between and in contact with the first outer epitaxial feature and the second outer epitaxial feature along a first direction; and
a gate structure disposed over and around the plurality of germanium-containing channel members,
wherein the plurality of germanium-containing channel members are spaced apart from the first inner epitaxial feature and the second inner epitaxial feature,
wherein the first outer epitaxial feature and the second outer epitaxial feature comprise a first p-type dopant,
wherein the first inner epitaxial feature and the second inner epitaxial feature comprise a second p-type dopant different from the first p-type dopant.

11. The semiconductor device of claim 10, wherein a diffusivity of the first p-type dopant in germanium is smaller than a diffusivity of the second p-type dopant in germanium.

12. The semiconductor device of claim 10, wherein an electrical conductivity of the first inner epitaxial feature and the second inner epitaxial feature is greater than an electrical conductivity of the first outer epitaxial feature and the second outer epitaxial feature.

13. The semiconductor device of claim 10,
wherein the first outer epitaxial feature and the second outer epitaxial feature comprise germanium and the first p-type dopant is boron,
wherein the first inner epitaxial feature and the second inner epitaxial feature comprise germanium and the second p-type dopant is gallium.

14. The semiconductor device of claim 13, wherein at least one of the first outer epitaxial feature and the second outer epitaxial feature includes a plurality of portions separated from one another.

15. The semiconductor device of claim 10, further comprising a top epitaxial feature disposed on the first inner epitaxial feature.

16. The semiconductor device of claim 10,
wherein the plurality of germanium-containing channel members are spaced apart from one another by a plurality of inner spacer features along a second direction perpendicular to the first direction, and
wherein the first inner epitaxial feature and the second inner epitaxial feature are in contact with the plurality of inner spacer features.

17. The semiconductor device of claim 10,
wherein the plurality of germanium-containing channel members are spaced apart from one another by a plurality of inner spacer features along a second direction perpendicular to the first direction, and
wherein the first inner epitaxial feature and the second inner epitaxial feature are spaced apart from the plurality of inner spacer features by the first outer epitaxial feature and the second outer epitaxial feature, respectively, along the first direction.

18. A semiconductor structure, comprising:
a first source/drain feature and a second source/drain feature disposed over a substrate, each of the first source/drain feature and the second source/drain feature comprising an outer liner layer and an inner filler layer;
a vertical stack of nanostructures over the substrate and extending between the first source/drain feature and the second source/drain feature along a first direction; and
a gate structure wrapping around each of the vertical stack of nanostructures,
wherein the outer liner layer comprises germanium and boron,
wherein the inner filler layer comprises germanium and gallium.

19. The semiconductor structure of claim 18, wherein end surfaces of the vertical stack of nanostructures are in direct contact with the outer liner layer and are spaced apart from the inner filler layer.

20. The semiconductor structure of claim 18, wherein the substrate is in direct contact with the outer liner layer but is spaced apart from the inner filler layer by the outer liner layer.

* * * * *